US010079536B2

United States Patent
Ishimaru et al.

(10) Patent No.: US 10,079,536 B2
(45) Date of Patent: Sep. 18, 2018

(54) RECTIFIER, ALTERNATOR USING SAME AND POWER SUPPLY USING SAME

(71) Applicant: Hitachi Power Semiconductor Device, Ltd., Hitachi-shi, Ibaraki (JP)

(72) Inventors: Tetsuya Ishimaru, Tokyo (JP); Shinichi Kurita, Ibaraki (JP); Takeshi Terakawa, Ibaraki (JP)

(73) Assignee: Hitachi Power Semiconductor Device, Ltd., Hitachi-shi (JP)

( * ) Notice: Subject to any disclaimer, the term of this patent is extended or adjusted under 35 U.S.C. 154(b) by 0 days.

(21) Appl. No.: 15/297,565

(22) Filed: Oct. 19, 2016

(65) Prior Publication Data

US 2017/0110959 A1    Apr. 20, 2017

(30) Foreign Application Priority Data

Oct. 20, 2015    (JP) ................................ 2015-206067

(51) Int. Cl.
*H02M 1/36*    (2007.01)
*H02K 7/00*    (2006.01)
(Continued)

(52) U.S. Cl.
CPC .............. *H02M 1/36* (2013.01); *H02K 7/006* (2013.01); *H02K 11/046* (2013.01); *H02M 1/08* (2013.01);
(Continued)

(58) Field of Classification Search
CPC .......... H02M 1/36; H02M 1/08; H02M 7/217; H02M 7/219; H02K 7/006; H02K 11/046; H03K 17/30; H03K 17/302
(Continued)

(56) References Cited

U.S. PATENT DOCUMENTS 6,747,880 B2 * 6/2004 Grover .............. H02M 3/33592
  363/21.06
8,416,548 B2 * 4/2013 Doffin ................ H03K 17/0822
  361/42
(Continued)

FOREIGN PATENT DOCUMENTS

EP    3 082 244 A1    10/2016
EP    3082244 A1 * 10/2016 ........... H03K 17/163
(Continued)

OTHER PUBLICATIONS

Extended European Search Report issued in counterpart European Application No. 16194871.6 dated Apr. 3, 2017 (8 pages).
(Continued)

*Primary Examiner* — Ryan Jager
(74) *Attorney, Agent, or Firm* — Crowell & Moring LLP

(57) ABSTRACT

The rectifier includes a rectification MOSFET; a comparator having the non-inverted input terminal connected to a drain of the rectification MOSFET and the inverted input terminal connected to a source of the rectification MOSFET, and the control circuit controlling ON and OFF of the rectification MOSFET by an output of the comparator. The control circuit includes the shutoff MOSFET for performing shutoff between the drain of the rectification MOSFET and the non-inverted input terminal of the comparator and the shutoff control circuit performing electrical shutoff between the drain of the rectification MOSFET and the non-inverted input terminal of the comparator by turning off the shutoff MOSFET when a voltage of the drain of the rectification MOSFET is equal to or higher than a first predetermined voltage.

11 Claims, 15 Drawing Sheets

(51) Int. Cl.
*H02K 11/04* (2016.01)
*H02M 7/217* (2006.01)
*H02M 1/08* (2006.01)
*H03K 17/30* (2006.01)
*H02M 7/219* (2006.01)

(52) U.S. Cl.
CPC ............ *H02M 7/217* (2013.01); *H03K 17/30* (2013.01); *H03K 17/302* (2013.01); *H02M 7/219* (2013.01); *H03K 2017/307* (2013.01); *H03K 2217/0081* (2013.01)

(58) Field of Classification Search
USPC .......................................................... 327/427
See application file for complete search history.

(56) References Cited

U.S. PATENT DOCUMENTS

2002/0141214 A1* 10/2002 Grover .............. H02M 3/33592
                                                              363/125
2007/0081371 A1* 4/2007 Wittenbreder, Jr. .... H02M 1/08
                                                              363/127
2007/0139083 A1   6/2007 Mirea et al.
2009/0060092 A1   3/2009 Higuchi
2015/0214850 A1   7/2015 Lin et al.
2016/0099658 A1*  4/2016 Ishimaru ............... H02M 7/219
                                                              310/68 D
2016/0315184 A1* 10/2016 Ishimaru ................ H01L 24/01
2017/0263516 A1*  9/2017 Ishimaru ................ H01L 23/13

FOREIGN PATENT DOCUMENTS

| JP | 2009-524403 A | 6/2009 |
| WO | WO 2007/083008 A2 | 7/2007 |
| WO | WO 2015/088020 A1 | 6/2015 |

OTHER PUBLICATIONS

Chinese-language Office Action issued in counterpart Chinese Application No. 201610890233.2 dated Jun. 28, 2018 with English translation (15 pages).

* cited by examiner

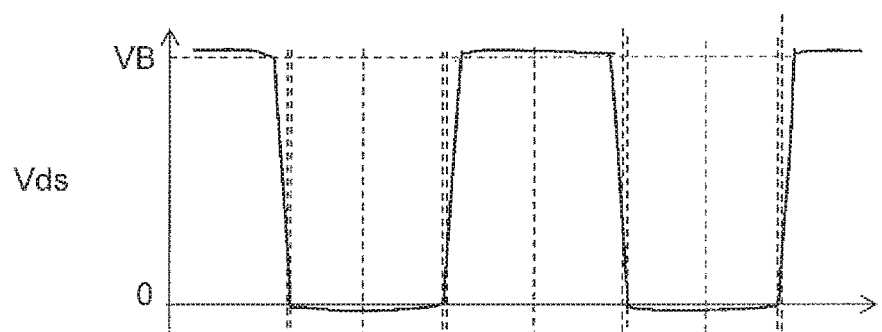
FIG.6A  Vds
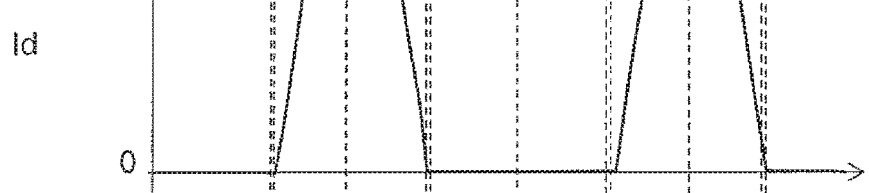
FIG.6B  Id
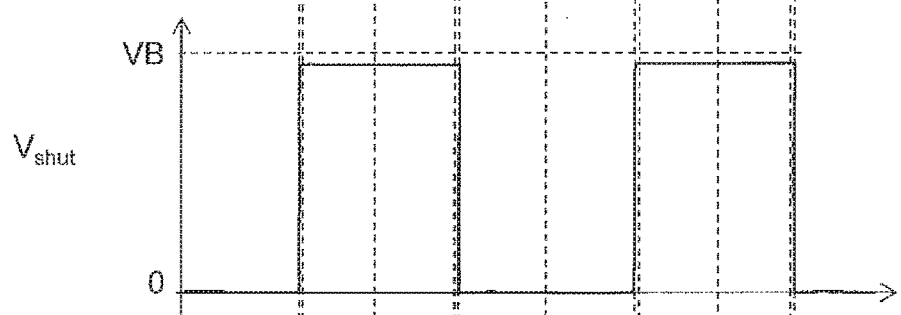
FIG.6C  $V_{shut}$
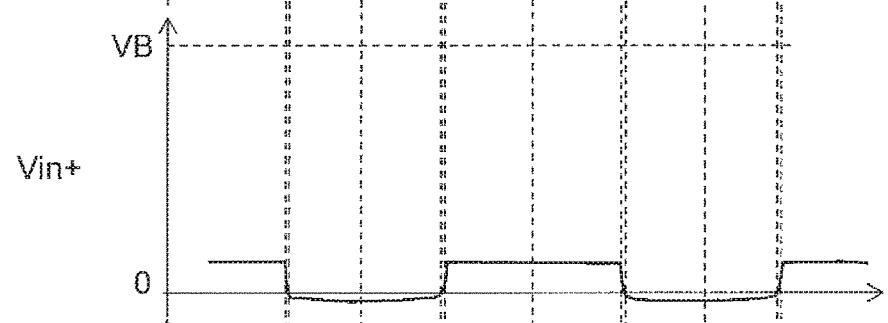
FIG.6D  Vin+
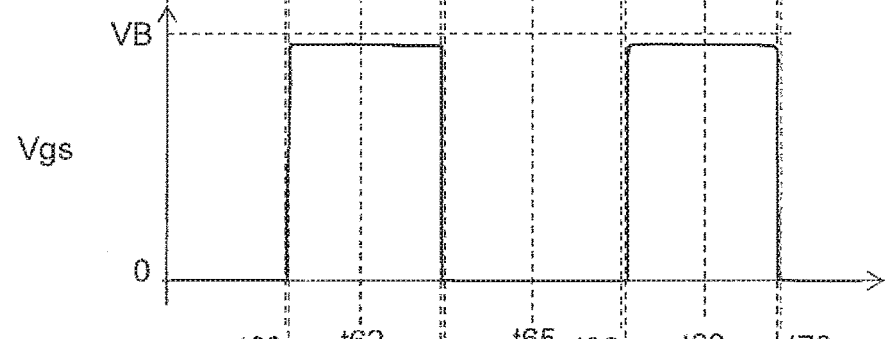
FIG.6E  Vgs

RECTIFIER, ALTERNATOR USING SAME AND POWER SUPPLY USING SAME

CROSS REFERENCE TO RELATED APPLICATION

The present application is based on Japanese application JP 2015-206067 filed on Oct. 20, 2015, the content of which is hereby incorporated by reference into this application.

BACKGROUND OF THE INVENTION

1. Field of the Invention

The present invention relates to a rectifier using an autonomous synchronous rectification MOSFET (Metal Oxide Semiconductor Field Effect Transistor) and an alternator and a power source using the rectifier.

2. Description of the Related Art

For an alternator for generating electricity in a vehicle, diodes have been used as a rectifying element. The diode has a large loss due to a large forward voltage drop in spite of a low cost. On the other hand, a MOSFET begins to be used as a rectifying element for the alternator in place of the diodes. Use of the MOSFET for synchronous rectification provides a rectifying element having a small loss without a large forward voltage drop in which the forward current increases from zero volts.

As a method of controlling the synchronous rectification MOSFET for the alternator between on and off, the method of controlling the MOSFET by detection of a position of a motor with a Hall element has been known. Such a method of performing control using an input signal from the external with the Hall element is called here an External control type. The external control type of the synchronous MOSFET needs to use a sensor such as the Hall element and it is necessary to perform a complicated control with a control circuit, so that a rectifying part of the alternator becomes expensive.

In Patent Document 1 (JP2009-524403), a column of problem in abstract describes "to provide a control device for a transistor to block a leak current", and a column of Solving means describes as follows:

To control a gate of the transistor by an output control signal, an amplifying device (15) is provided which includes a first input connected to a drain of the transistor for forming a first connection overall and a second input connected to a source of the transistor to form a second connection overall. Further at least one protection device is provided which includes at least one switching device (T1) serially inserted in the first connection of the amplifying device (15) and a generation device configured to generate a regulation voltage to control the transistor and to allow the same number of semiconductor junctions to exist in the first and second connections. This is applicable to a charging device for a battery.

Patent Document 1: JP2009-524403

There are two types of comparators for determination between on and off of a MOSFET in accordance with a drain-source voltage, namely, a bipolar type of comparator configured with bipolar transistors and a C-MOS (Complementary MOS) type of a comparator configured with MOSFETs. When the comparator of the C-MOS type is used, though an input offset voltage cannot be decreased too much, a consumed current can be decreased. Smaller consumed current of the comparator decreases a consumed current in a control circuit and decreases capacitance and size of a capacitor supplying a power source voltage to the control circuit.

When the comparator of the C-MOS type is used, an input terminal of the comparator is connected to a gate of a MOSFET included in the comparator. Two input terminals of the comparator are connected to gates of the MOSFETs included in the comparator inside the comparator and to a source and a drain of the synchronous rectification MOSFET outside the comparator. A drain of the synchronous rectification MOSFET is supplied with a high voltage of a battery connected to an alternator, and the high voltage is applied to a gate of the MOSFET connected to the input terminal of the comparator. Application of the high voltage to the gate of the MOSFET causes deterioration of the gate insulation film such as HCI (Hot Carrier Injection), TDDB (Time Dependent Dielectric Breakdown), and PBTI (Positive Bias Temperature Instability), which may change a threshold voltage of the MOSFET.

SUMMARY OF THE INVENTION

An aspect of the present invention provides a rectifier using an autonomous synchronous rectification MOSFET, an alternator and a power supply using the rectifier, which can perform rectification operations normally without characteristic change due to the high voltage application any time during the rectification operation, during the application of the reverse surge, or during the stop of the vehicle.

An aspect of the present invention provides a rectifier comprising:
 a rectification MOSFET which performs rectification; and
 a control circuit including a comparator including:
  a first input terminal connected to a drain of the rectification MOSFET;
  a second input terminal connected to a source of the rectifying comparator; and
  an output which controls turning on and off of the rectification MOSFET,
 The control circuit may further include:
  a shutoff MOSFET, installed between the drain of the rectification MOSFET and the first input terminal of the comparator, performing shutoff; and
  a shutoff control circuit which turns off the shutoff MOSFET to shut off electrically the lines between the drain of the rectification MOSFET and the first input terminal of the comparator when a voltage of the drain of the rectification MOSFET is equal to or higher than a first predetermined voltage, and turns on the shutoff MOSFET to conduct electrically the line between the drain of the rectification MOSFET and the first input of the comparator when the voltage of the drain of the rectification MOSFET is lower than the first predetermined voltage.

Other means are described in the embodiments described below.

According to the aspect of the present invention, there is provided a rectifier using an autonomous synchronous rectification MOSFET, an alternator and power supply using the rectifier, which can perform rectification operations normally without characteristic change due to the high voltage application any time during the rectification operation, during the application of the reverse surge, or during the stop of the vehicle.

BRIEF DESCRIPTION OF THE DRAWINGS

FIGS. 6A to 6E are charts of voltage and current waveforms in the rectifier in a rectification operation in the first embodiment.

DETAILED DESCRIPTION OF THE INVENTION

Prior to describing embodiments of the present invention, a study regarding the present invention by the inventors on deterioration of the gate insulation film such as HCI (Hot Carrier Injection), TDDB (Time Dependent Dielectric Breakdown), and PBTI (Positive Bias Temperature Instability), which may change a threshold voltage of the MOSFET, is described below.

Figure 16A:
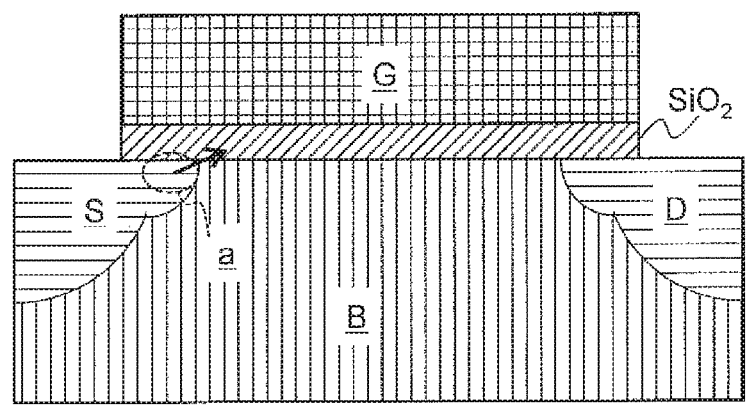
FIGS. 16A and 16B show cross-sectional views of a MOSFET for explaining deterioration phenomenon of the MOSFET according to the present invention.
Figure 16B:
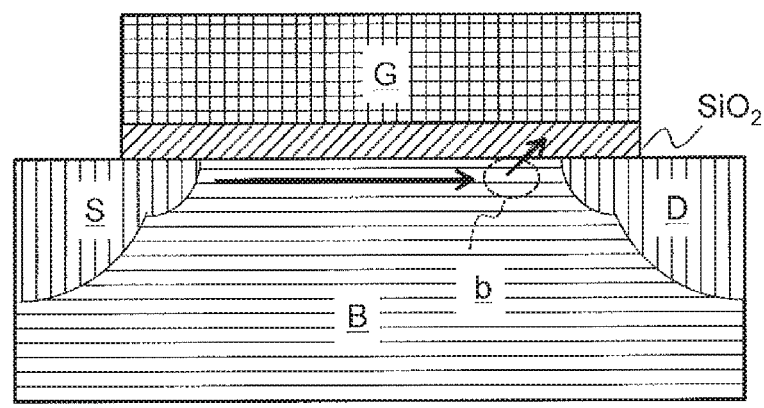

FIGS. 16A and 16B are cross-sectional views for explaining a deterioration phenomenon of HCI.

FIG. 16A illustrates the HCI of an electron generated by Band To Band Tunneling.

When a positive high voltage is applied to a gate G of a P-type MOSFET, the high voltage applied between the gate G and a source S generates electron-hole pairs by Band To Band Tunneling in a region indicated by "a" in a diffusion layer of the source S. In the instance, when a voltage positively greater than the voltage of the source S is applied to the substrate B, the electrons are accelerated between the source S and the substrate B, attracted by the positive voltage of the gate, and injected into the gate oxide $SiO_2$. The electrons trapped by the gate oxide $SiO_2$ shift the threshold voltage of the MOSFET in a positive direction.

FIG. 16B illustrates the HCI of an electron flowing through the channel.

A high voltage is applied between a source S and a drain D of an n-type MOSFET, the electrons flowing in a channel are accelerated at an end of the drain, are attracted by a positive voltage of the gate G and injected into a gate oxide $SiO_2$. The electrons trapped by the gate oxide $SiO_2$ shift the threshold voltage of the MOSFET in a positive direction.

The TDDB occurs after a high voltage is applied to the gate G of the MOSFET for a long period. When the positive high voltage is applied to the gate G, electrons continuously flow from the gate G to the substrate B, and holes continuously flow through the gate oxide to the gate G. This generates defects in the gate oxide film. Due to the holes or the electrons trapped by the defect the threshold voltage of the MOSFET shifts in the positive direction or a negative direction. Application of a high electric field to the gate oxide film by applying a high voltage to the substrate B also can generate a shift of the threshold voltage of the MOSFET.

The PBTI occurs after a positive voltage is applied to the gate G of the n-type MOSFET at a high temperature for a long period. The application of the positive voltage for the long period at the high temperature generates defects capturing electrons at an interface between Si of the substrate and the gate oxide film and in the gate oxide film. This shifts the threshold voltage of the MOSFET in the negative direction.

As described above, the application of the high positive voltage to the gate of the MOSFET shifts the threshold voltage of the MOSFET. When the threshold voltage of the MOSFET connected to an input terminal of the comparator shifts, an input voltage determining switching between ON and OFF at an output of the comparator shifts, and turning on and off the autonomous synchronous rectification MOSFET cannot be provided properly. More specifically, when the input voltage turning on and off of the comparator output shifts in a positive direction, timing at which the synchronous rectification MOSFET turns off is delayed. In the case of too much delay, even when a reverse voltage is applied, the MOSFET keeps turning on and a reverse current flows in the MOSFET.

When the input voltage turning on and off of the comparator output shifts in a negative direction, timing at which the synchronous rectification MOSFET turns on is delayed. In the case of too much delay, the MOSFET does not turn on even when a large rectification current flows.

The high voltage is applied to the drain of the synchronous rectification MOSFET, i.e., the gate of the MOSFET to which an input terminal of the comparator is connected during a stop of the vehicle, during an operation of the vehicle and an operation of the rectification in the alternator, and also during an application of a reverse surge of the damp load.

Hereinafter, embodiments of the present invention are described below in detail with reference to each of drawings. The same parts having the same function are designated with the same or like references in each of the drawings. In the description of the embodiments, a description of the same or like part will be omitted without repeating except it is necessary.

Figure 1:
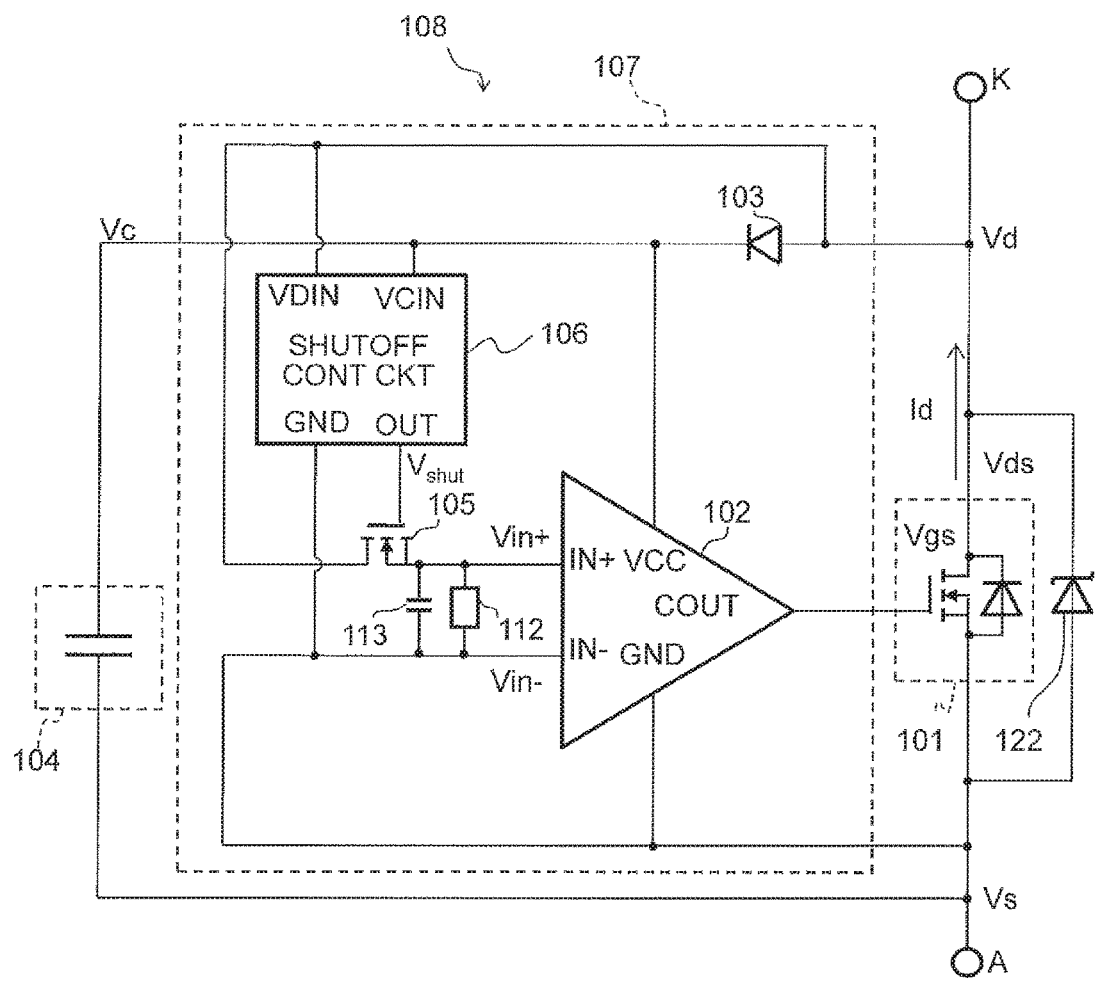
FIG. 1 is a circuit diagram of a rectifier using an autonomous synchronous rectification MOSFET according to a first embodiment.

FIG. 1 is a circuit diagram of a rectifier 108 using an autonomous synchronous rectification MOSFET according to a first embodiment.

As shown in FIG. 1, the rectifier 108 using the autonomous synchronous rectification MOSFET according to the first embodiment is configured including two external terminals, i.e., a positive-side main terminal K and a negative-side main terminal A, a rectification MOSFET 101, a capacitor 104, and a control circuit 107. Further, the control circuit 107 is configured further including a comparator 102, a diode 103, a shutoff MOSFET 105, a shutoff control circuit 106, a resistive element 112, a capacitor 113, and a Zener diode 122.

The rectification MOSFET 101 includes a parasitic diode therein and performs rectification. The control circuit 107 includes a comparator 102. A non-inverted input terminal IN+(first input terminal) of the comparator 102 is connected to a drain of the rectification MOSFET 101 through the shutoff MOSFET 105, and an inverted input terminal IN− (second input terminal) of the comparator 102 is connected to a source of the rectification MOSFET 101. The comparator 102 controls ON and OFF of the rectification MOSFET 101.

As the rectification MOSFET 101, a power MOSFET is used to allow a large intensity current generated by the alternator to flow therethrough. The rectification MOSFET 101 performs synchronous rectification to allow a current Id to flow therethrough. The drain of the rectification MOSFET 101 is connected to the positive-side main terminal K, and the source thereof is connected to the negative-side main terminal A. Accordingly, the parasitic diode of the rectification MOSFET 101 is connected, at an anode thereof, to the negative-side main terminal A, and the cathode thereof is connected to the positive-side main terminal K.

The drain of the rectification MOSFET 101 is supplied with a drain voltage Vd, and the source thereof is supplied with the source voltage Vs. A voltage applied between the drain and source of the rectification MOSFET 101 is Vds (=Vd−Vs), and a voltage applied between the gate and the source is Vgs.

The comparator 102 is connected, at the non-inverted input terminal IN+, to the drain of the rectification MOSFET 101 and at an inverted input terminal IN−, directly to the source of the rectification MOSFET 101. An output terminal COUT of the comparator 102 is connected to the gate terminal of the rectification MOSFET 101. The comparator 102 outputs an output signal at the output terminal COUT. The comparator 102 is a circuit which compares the voltage of the non-inverted input terminal IN+ with the voltage of the inverted input terminal IN− and switches the output signal in accordance with the intensities of voltages. The comparator 102 outputs a comparing result of a source voltage Vs at the negative-side main terminal A with the drain voltage Vd at the positive-side main terminal K. It is desirable that a performance in accuracy of the comparator 102 is high.

The diode 103 is connected to have a forward direction from the positive-side main terminal K to a positive-side terminal of the capacitor 104. Charges flowing through the diode 103 are stored in the capacitor 104 which acts as a power source to drive the control circuit 107.

The shutoff MOSFET 105 is connected between the non-inverted input terminal IN+ of the comparator 102 and the drain of the rectification MOSFET 101 and operates when a voltage Vshut is applied to the gate of the shutoff MOSFET 105. The shutoff MOSFET 105 is connected in such a direction that an anode of a parasitic diode of the shutoff MOSFET 105 is connected to a side of the non-inverted input terminal IN+, and the cathode of a parasitic diode of the shutoff MOSFET 105 is connected to a side of a drain of the rectification MOSFET 101. When the shutoff MOSFET 105 is an n-type MOSFET, the source of the shutoff MOSFET 105 is connected to a side of the non-inverted input terminal IN+ of the comparator 102, and the drain of the shutoff MOSFET 105 is connected to a side of the drain of the rectification MOSFET 101. Connection as described above prevents the high positive voltage at the drain of the rectification MOSFET 101 from being transmitted to the non-inverted input terminal IN+ of the comparator 102 through the parasitic diode of the shutoff MOSFET 105.

It is desirable that the non-inverted input terminal IN+ of the comparator 102 is connected to the drain of the rectification MOSFET 101 without having a resistor other than the shutoff MOSFET 105 interposed between them. It is desirable that the inverted input terminal IN− is connected to the source of the rectification MOSFET 101 without intervening of a resistor. This can prevent voltage fluctuations at an input terminal of the comparator 102 depending on dispersion in resistance value and temperature variation.

The resistive element 112 is connected between the non-inverted input terminal IN+ and the inverted input terminal IN− of the comparator 102 in the control circuit 107. Connection of the non-inverted input terminal IN+ to the inverted input terminal IN− through the resistive element 112 can prevent the non-inverted input terminal IN+ to be in floating state when shutoff is made by the shutoff MOSFET 105.

The capacitor 113 is connected between the non-inverted input terminal IN+ and the inverted input terminal IN− of the comparator 102 in the control circuit 107. The capacitor 113 is provided to hold the voltage Vin+ at the non-inverted input terminal IN+ of the comparator 102+after shutoff of the shutoff MOSFET 105 to prevent the inversion of the output of the comparator 102 which is due to the lower voltage Vin+ than the voltage Vin− at the inverted input terminal IN− of the comparator 102. When a capacitance of the non-inverted input terminal IN+ of the comparator 102+after shutoff of the shutoff MOSFET 105 is large, or when a period of a rectification operation is short, the capacitor 113 is not necessarily needed.

The shutoff control circuit 106 includes a capacitor voltage input terminal VCIN connected to a positive-side terminal of the capacitor 104, a drain voltage input terminal VDIN connected to a drain of the rectification MOSFET 101, a ground terminal GND connected to a source of the rectification MOSFET 101, and an output terminal OUT connected to a gate of the shutoff MOSFET 105. When a potential of the ground terminal GND is referred, the drain voltage input terminal VDIN is supplied with the voltage Vds and the capacitor voltage input terminal VCIN is supplied with a voltage Vc. A voltage of the output terminal OUT is Vshut.

The shutoff control circuit 106 controls ON and OFF of the shutoff MOSFET 105. It is not always necessary that the terminals and wiring of the shutoff control circuit 106 are provided as described above. However, the terminals and wiring may be modified in accordance with the circuit configuration of the shutoff control circuit 106.

The Zener diode 122 forms a clamp circuit. When a reverse direction surge occurs, the Zener diode 122 absorbs the surge by making the surge current bypassed between the drain and the source of the rectification MOSFET 101. The operation upon occurrence of the reverse direction surge will be described later in detail with reference to FIGS. 7A to 7D.

The control circuit 107 is configured including the comparator 102, the diode 103, the shutoff MOSFET 105, and the shutoff control circuit 106 for electrical shutoff (disconnect) between the drain of the rectification MOSFET 101 and the non-inverted input terminal IN+ of the comparator 102. The control circuit 107 is formed by a single chip to be made as a one-chip IC (Integrated Circuit) to have merits, such as a low cost, a small bottom area, and a high noise resistivity.

The capacitor 104 is a component for supplying an electric power supply to drive the control circuit 107. Hereinafter, description is made with assumption that a voltage between both terminals of the capacitor 104 is Vc. Use of the capacitor 104 for the power supply enables the rectifier 108 to have two terminals, which provides compatibility with the terminals of rectification diodes conventionally used for an alternator 140. This can enhance a performance of the alternator 140 by replacing the conventional rectification diode with the rectifier 108.

Hereinafter, an example of a circuit configuration of the comparator 102 of the rectifier 108 and its operation are described with reference to FIG. 2, and an example of a circuit configuration of the shutoff control circuit 106 in the rectifier 108 and the operation are described with reference to FIG. 3.

Figure 2:
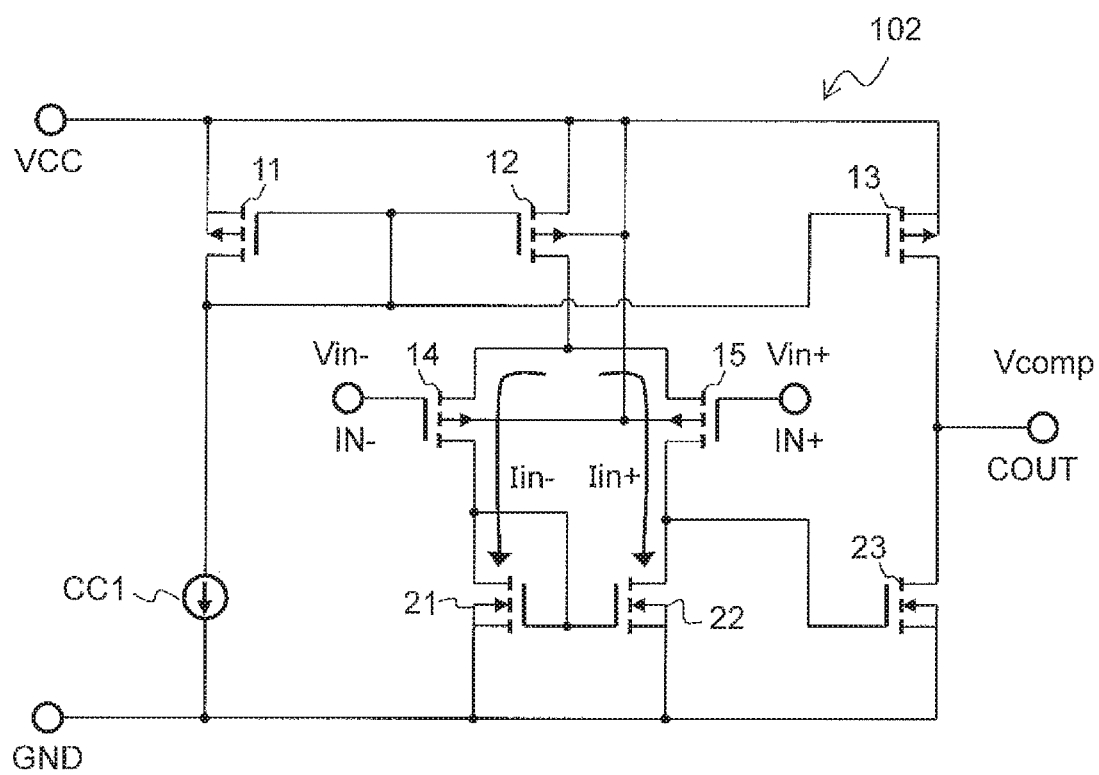
FIG. 2 is a circuit diagram of a comparator included in the rectifier according to the first embodiment.

FIG. 2 is a circuit diagram showing an example of the comparator 102 included in the rectifier 108 according to the first embodiment.

As shown in FIG. 2, the comparator 102 is configured including a plurality of MOSFETs. The comparator 102 includes the constant current circuit CC1, PMOSs 11, 12, 13, 14, and NMOSs 21, 22, 23. The comparator 102 operates while a power is supplied between the source voltage terminal VCC and the ground terminal GND. The comparator 102 compares a voltage Vin+ applied to the non-inverted input terminal IN+ with a voltage Vin− applied to the inverted input terminal IN− to make a determination.

The PMOSs 11, 12, 13 form a mirror circuit. More specifically, sources of the PMOSs 11, 12, 13 are connected to the source voltage terminal VCC. Gates of the PMOSs 11, 12, 13 and a drain of the PMOS 11 are connected each other and to the constant current circuit CC1. The constant current circuit CC1 is connected to allow a current to flow from the gates of the PMOSs 11, 12, 13, and a connection node of the PMOS 11 toward the ground terminal GND.

A drain of the PMOS 12 is connected to the sources of the PMOSs 14, 15. Back gates of the PMOSs 12, 14, 15 are connected to the source voltage terminal VCC. The gate of the PMOS 14 is connected to the inverted input terminal IN−. The gate of the PMOS 15 is connected to the non-inverted input terminal IN+. The drain of the PMOS 14 is connected to a drain of the NMOS 21 and gates of the NMOSs 21, 22. A drain of the PMOS 15 is connected to a drain of a NMOS 22 and a gate of an NMOS 23. The sources of the NMOSs 21, 23 are connected to the ground terminal GND.

The drain of the PMOS 13 and a drain of the NMOS 23 are connected to the output terminal COUT. The output terminal COUT is supplied with a voltage Vcomp.

An operation of the comparator 102 shown in FIG. 2 is described below.

When the voltage Vin+ at the non-inverted input terminal IN+ of the comparator 102 becomes lower than the voltage Vin− at the inverted input terminal IN−, out of a current flowing through the PMOS 12 a current flowing through the PMOS 14 becomes lower than a current flowing through the PMOS 15. Also a current flowing through the NMOS 21 decreases and turns off. Also the NMOS 22 to which the same gate voltage is applied turns off, so that a gate voltage of the NMOS 23 increases and the NMOS 23 turns on. As a result, a voltage of a L level is outputted at the output terminal COUT.

When the voltage Vin+ at the non-inverted input terminal IN+ of the comparator 102 becomes higher than the voltage Vin− at the inverted input terminal IN−, out of a current flowing through the PMOS 12 the current flowing through the PMOS 14 becomes higher than the current flowing through the PMOS 15. The current flowing through the PMOS 14 flows into the NMOS 21 and turns on the NMOS 21. The NMOS 22 supplied with the gate voltage which is the same as that of the NMOS 21, turns on, so that the gate voltage of the NMOS 23 decreases and the NMOS 23 turns off. As a result, a voltage of the H level applied to the source voltage terminal VCC is outputted at the output terminal COUT.

FIG. 2 shows the comparator circuit in which the non-inverted input terminal IN+ and the inverted input terminal IN− of the comparator 102 are connected to the gates of p-type MOSFETs. However, a comparator circuit in which the non-inverted input terminal IN+ and the inverted input terminal IN− of the comparator 102 are connected to gates of n-type MOSFETs, may be used. In this case, an offset circuit is added to the inputs of the comparator 102 to switch the rectification MOSFET 101 (see FIG. 1) between ON and OFF when the input voltages of the comparator 102 are positive.

Figure 3:
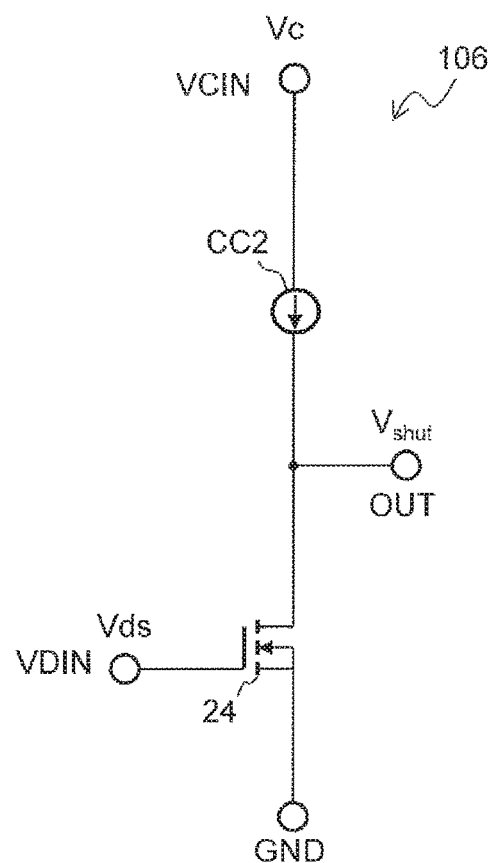
FIG. 3 is a circuit diagram of a shutoff control circuit included in the rectifier according to the first embodiment.

Next, FIG. 3 is an example of a circuit diagram of the shutoff control circuit 106 of the rectifier 108 according to the first embodiment.

A configuration of the shutoff control circuit 106 shown in FIG. 3 is described below. A shutoff control circuit 106 includes an NMOS 24 and a constant current circuit CC2.

The drain voltage input terminal VDIN is connected to a gate of the NMOS 24. The capacitor voltage input terminal VCIN is connected to the constant current circuit CC2 which is connected to a drain of the NMOS 24. A source of the NMOS 24 is connected to the ground terminal GND. Further, the output terminal OUT is connected to a wiring connecting the constant current circuit CC2 with the NMOS 24. Turning On the NMOS 24 turns OFF the shutoff MOSFET 105 (see FIG. 1), and turning OFF the NMOS 24 turns On the shutoff MOSFET 105.

The constant current circuit CC2 is a device for restricting a current flowing from the drain voltage input terminal VDIN to the ground terminal GND to reduce a consumed current of the control circuit 107. As the constant current circuit CC2, an n-type depression MOSFET of which the gate is short-circuited to the source is used. Instead of the constant current circuit CC2, a resistor having a high resistance may be used. Hereinafter, also instead of the constant current circuits CC3 to CC6 used in modified examples of the shutoff control circuit may be used similarly.

Figure 4:
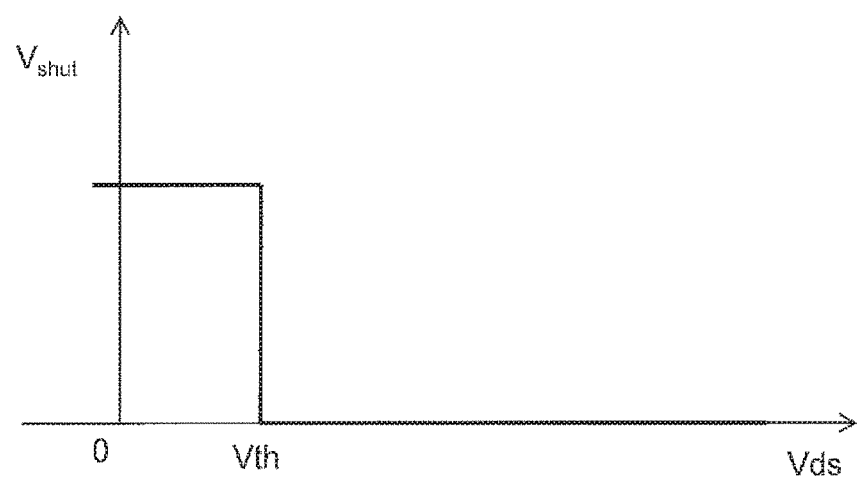
FIG. 4 shows a chart illustrating an operation of the shutoff control circuit according to the first embodiment.

FIG. 4 shows a chart illustrating an operation of the shutoff control circuit 106 according to the first embodiment. The axis of ordinates represents the voltage Vshut and the axis of abscissa represents the voltage Vds. Hereinafter an operation of the shutoff control circuit 106 is described below referring to FIGS. 3 and 4.

The capacitor voltage input terminal VCIN is supplied with the voltage Vc of the capacitor 104. When the voltage Vds at a drain voltage input terminal VDIN is smaller than a threshold voltage Vth of the NMOS 24, the NMOS 24 turns off. Accordingly, the voltage Vshut at the output terminal OUT corresponding to the H level voltage equal to the voltage Vc.

Inversely, when the voltage Vds at the drain voltage input terminal VDIN is larger than the threshold voltage Vth of the NMOS 24, the NMOS 24 turns on. This brings the voltage Vshut at the output terminal OUT to a voltage of the L level.

Figure 5:
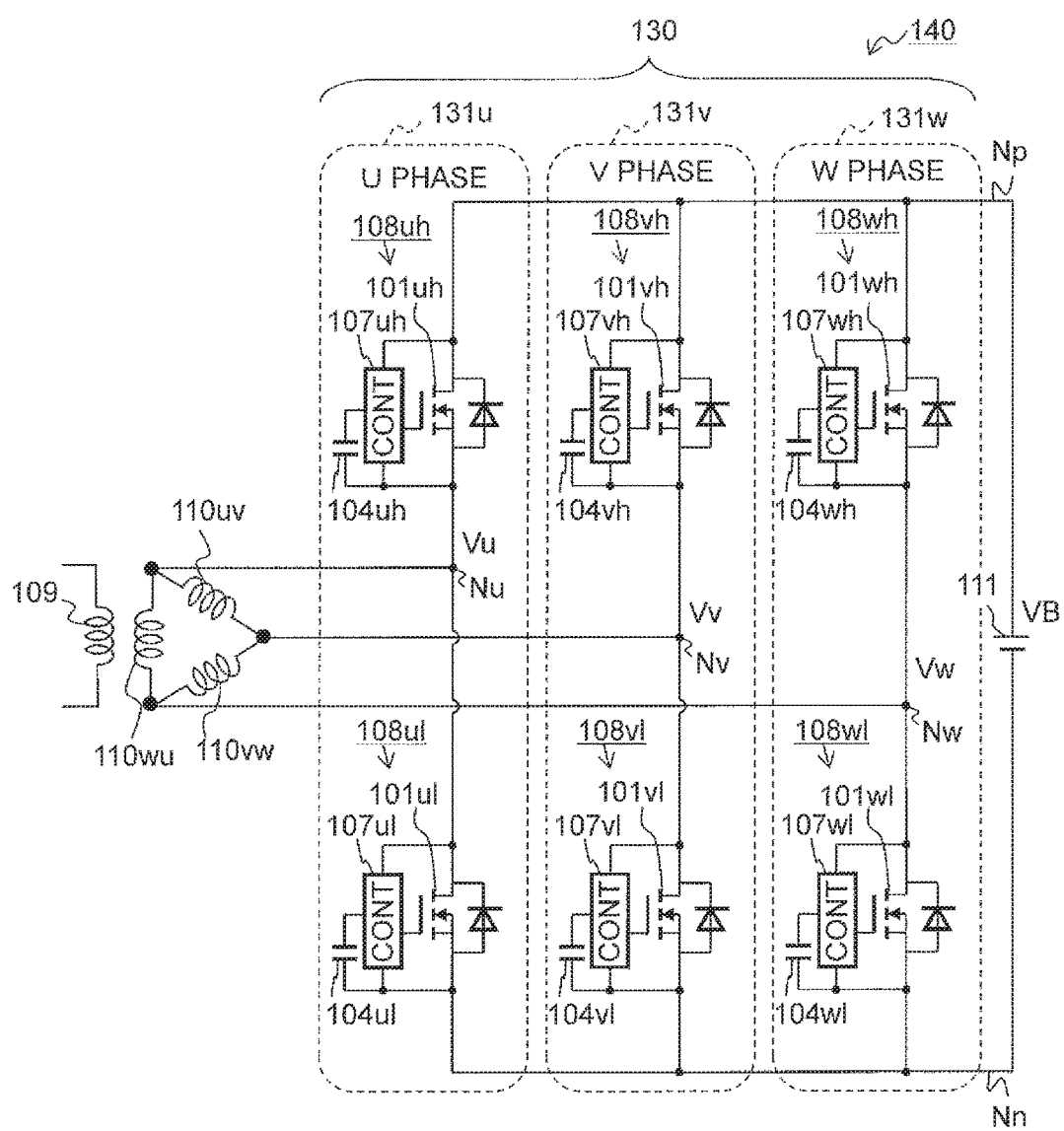
FIG. 5 is a circuit diagram illustrating a general configuration of an alternator using the rectifier according to the first embodiment.

FIG. 5 is a circuit diagram illustrating a general configuration of the alternator 140 using the rectifier 108 of the autonomous type.

As shown in FIG. 5, the alternator 140 using the rectifier 108 with an autonomous synchronous rectification MOSFET is composed of a power generating part configured including a rotor coil 109, and stator coils 110*uv*, 110*vw*, 110*wu* and a rectification circuit 130.

The generating part is configured including the rotor coil 109, the three stator coils 110*uv*, 110*vw*, 110*wu* which are Δ-connected. A middle point wiring of a U-phase leg 131*u* is connected to a node to which the stator coils 110*wu*, 110*uv* are connected. A middle point wiring of a V-phase leg 131*v* is connected to a node to which the stator coils 110*uv*, 110*vw* are connected. A middle point wiring of a W-phase leg 131*w* is drawn from a node to which the stator coils 110*vw*, 110*wu* are connected. The connections of the stator coils 110*uv*, 110*vw*, 110*wu* may be Y connection instead the Δ-connection and not limited thereto.

A rectification circuit 130 is configured including a U-phase leg 131*u*, a V-phase leg 131*v* and a W-phase leg 131*w*, which rectify three-phase alternating currents among nodes Nu, Nv, Nw into a direct current to flow between nodes Np, Nn (between DC terminals). The node Nu connected to the middle point wiring of the U-phase leg 131*u* is connected to a rectifier 108*uh* at a high side from the node Nu and a rectifier 108*ul* at a low side from the node Nu. The node Nv connected to the middle point wiring of the V-phase leg 131*v* is connected to a rectifier 108*vh* at a high side from the node Nu and a rectifier 108*vl* at a low side from the node Nv. The node Nw connected to the middle point wiring of the W-phase leg 131*w* is connected to a rectifier 108*wh* at a high side from the node Nw and a rectifier 108*wl* at a high side from the node Nw. The rectifiers 108*uh*, 108*vh*, 108*wh* are connected to a positive-side terminal of a battery 111 (energy storage) through the node Np on a positive terminal side of the direct current. The rectifiers 108*ul*, 108*vl*, 108*wl* are connected to a negative-side terminal of the battery 111 through the node Nn on a negative terminal side of the direct current.

The battery 111 (energy storage) is, for example, an in-vehicle battery, and its operation range is about 10.8V to 14V.

The rectifier 108*uh* on the high side of the U-phase leg 131*u* is configured including the rectification MOSFET 101*uh*, a control circuit 107*uh*, and a capacitor 104*uh*. Similarly, the rectifier 108*ul* on the lower side of the U-phase leg 131*u* is configured including the rectification MOSFET 101*ul*, a control circuit 107*ul*, and a capacitor 104*ul*.

The rectifier 108*vh* on the high side of the V-phase leg 131*v* is configured including the rectification MOSFET 101*vh*, a control circuit 107*vh*, and a capacitor 104*vh*.

The rectifier 108*vl* on the low side of the V-phase leg 131*v* is similarly configured including the rectification MOSFET 101*vl*, a control circuit 107*vl*, and a capacitor 104*vl*.

The rectifier 108*wh* on the high side of the W-phase leg 131*w* is configured including the rectification MOSFET 101*wh*, a control circuit 107*wh*, and a capacitor 104*wh*.

The rectifier 108*wl* on the low side of the W-phase leg 131*w* is configured including the rectification MOSFET 101*wl*, a control circuit 107*wl*, and a capacitor 104*wl*.

Hereinafter, when respective rectifiers 108*uh* to 108*wl* are not specifically distinguished, the rectifiers are designated as rectifiers 108, 108A, 108B in respective embodiments. When the respective control circuits 107*uh* to 107*wl* are not specifically distinguished, the control circuits are designated as the control circuit 107 in each of embodiments. When the respective rectification MOSFETs 101*uh* to 101*wl* are not specifically distinguished, the rectification MOSFETs are simply designated as the rectification MOSFETs 101. When the respective capacitors 104*uh* to 104*wl* are not specifically distinguished, they are simply referred as capacitors 104.

FIGS. 6A to 6E show charts of waveforms during a rectification operation in the rectifier 108 including autonomous synchronous rectification MOSFET with two external terminals in the first embodiment. Axes of abscissas in FIGS. 6A to 6E represent time commonly in each charts.

FIGS. 6A to 6E show waveforms of voltages and currents of a rectifier 108*ul* used on the low side of the U-phase leg 131*u* (see FIG. 5) for the period while the rectification MOSFET 101*ul* turns on and for prior and post periods of the period. Hereinafter the rectifier 108*ul* may be simply designated as the rectifier 108. A rectification MOSFET 101*ul* may be simply designated as the rectification MOSFET 101. Hereinafter each of waveforms is described appropriately referring to FIG. 5.

FIG. 6A is a chart illustrating the voltage Vka between two external terminals of the rectifier 108, i. e., the voltage Vds between the drain and the source of the rectification MOSFET 101. The voltage Vds is the same as the voltage applied between the non-inverted input terminal IN+ and the inverted input terminal IN− of the comparator 102 and also the same as the voltage applied between the non-inverted input terminal IN+ and the ground terminal GND of the comparator 102.

FIG. 6B shows a chart illustrating a drain current Id of the rectification MOSFET 101. The drain current Id is a rectified current.

FIG. 6C is a chart illustrating the voltage Vshut at the output terminal OUT of the shutoff control circuit 106 in the control circuit 107.

The voltage Vshut is applied to the gate of the shutoff MOSFET 105 in the control circuit 107.

FIG. 6D shows a chart illustrating the voltage Vin+ at the non-inverted input terminal IN+ of the comparator 102 in the control circuit 107. The voltage Vin+ at the non-inverted input terminal IN+ of the comparator 102 is a voltage applied to the gate of the PMOS 15 in the circuit of the comparator 102 shown in FIG. 2.

FIG. 6E is a chart illustrating the gate voltage Vgs of the rectification MOSFET 101. The gate voltage Vgs corresponds to the voltage at the output terminal COUT of the comparator 102.

FIGS. 6A to 6E show waveforms of voltages and currents in the rectifier 108*ul* used at the low side of the U-phase leg 131*u*. However, waveforms of voltages and currents in the rectifier 108*uh* at the high side of the U-phase leg 131*u* become the same waveforms when the negative-side main terminal A of the rectifying element is based on. Further, each of the rectifiers 108 used at the low side and the high side of the V-phase leg 131*v* and the W-phase leg 131*w* has also the same waveforms similarly.

Based on FIGS. 6A to 6E, the operation of the rectifier 108 using the autonomous synchronous rectification MOSFET at a period from a time t62 to t68 is described below. The period from the time t62 to the time t68 is one cycle of operation, and the same operations are repeated before and after the period.

Power generation at the alternator 140 is performed by rotation of the rotor coil 109 in the stator coils 110*uv*, 110*vw*, 110*wu*. During this, voltages Vu, Vv, Vw at the middle point wirings periodically increase and decrease by the AC powers.

The voltages Vu, Vv, Vw at the middle point wirings are equal to voltages of the positive-side main terminals K of the rectifying elements at the low side, respectively. A voltage of the negative-side terminal of the battery 111 is equal to voltages of the negative-side main terminal A of the rectifying elements at the low side.

At the time t62, as shown in FIG. 6A, the voltage Vds of a negative voltage is applied between the drain and the source of the rectification MOSFET 101 of the rectifier 108ul, and as shown in FIG. 6B, the rectification MOSFET 101 of the rectifier 108ul at the low side is in an ON state and causes a rectified current to flow therethrough. An absolute value of the voltage Vds is an ON voltage of the rectification MOSFET 101. The NMOS 24 of the shutoff control circuit 106 whose gate is supplied with the voltage Vds, is in an OFF state, and, as shown in FIG. 6C, a voltage having the H level stored at the capacitor 104 is outputted at the output terminal OUT. The shutoff MOSFET 105 is in an ON state, so that the drain of the rectification MOSFET 101 is electrically connected to the non-inverted input terminal IN+ of the comparator 102 in the control circuit 107. As a result, as shown in FIGS. 6A and 6D, the voltage Vin+ at the non-inverted input terminal IN+ of the comparator 102 becomes the same as the voltage Vds between the drain and the source of the rectification MOSFET 101.

In this state, the drain voltage Vd of the rectification MOSFET 101 is applied to the non-inverted input terminal IN+ of the comparator 102, and the source voltage Vs of the rectification MOSFET 101 is applied to the inverted input terminal IN− of the comparator 102. Accordingly, the rectifier 108ul can perform an autonomous synchronous rectification operation. At the time t62, the voltage Vds is a negative voltage. Accordingly, as shown in FIG. 6E, at the output terminal COUT of the comparator 102, i.e., the gate of the rectification MOSFET 101, a voltage of the H level, which is equal to that of the capacitor 104, is outputted, and the rectification MOSFET 101 turns on. Rectification by conduction of the rectification MOSFET 101 provides a low loss.

At time 63, the voltage Vu at the middle point wiring (see FIG. 5) exceeds a voltage at a negative-side terminal Nn of the battery 111. As shown in FIG. 6A, the voltage Vds between the drain and the source becomes positive, and as shown in FIG. 6B, the drain current Id stops flowing. The voltage Vds is positive but is lower than a threshold voltage Vth of the NMOS 24 of the shutoff control circuit 106, which keeps the NMOS 24 in an OFF state. As a result, as shown in FIG. 6C, at the output terminal OUT of the shutoff control circuit 106, the voltage Vshut of the H level which is equal to that of the capacitor 104, keeps being outputted and the shutoff MOSFET 105 keeps turning on. Namely, the connection to the input terminals of the comparator 102 is the same as that when the rectified current is allowed to flow at time t62. Because the voltage Vds between the drain and the source of the rectification MOSFET 101 becomes a positive, as shown in FIG. 6E, a voltage of the L level is applied to the output terminal COUT of the comparator 102, i.e., the gate of the rectification MOSFET 101, so that the rectification MOSFET 101 turns off.

The voltage Vu of the middle point wiring is further increasing, and higher than the threshold voltage Vth of the NMOS 24 in the shutoff control circuit 106 at time t64. Accordingly, the NMOS 24 turns on, so that the voltage Vshut at the output terminal OUT of the shutoff control circuit 106 changes to the voltage of the L level as shown in FIG. 6C. The shutoff MOSFET 105 turns off to electrically shut off a line (connection) between the drain of the rectification MOSFET 101 and the non-inverted input terminal IN+ of the comparator 102 in the control circuit 107.

As shown in FIG. 6A, between the time t64 and the time t65 the voltage Vds between the drain and the source of the rectification MOSFET 101 increases to have a high voltage. On the other hand, as shown in FIG. 6C, the voltage Vin+ at the non-inverted input terminal IN+ of the comparator 102 keeps a low voltage after the shutoff is made at the time t64 between the drain of the rectification MOSFET 101 and the non-inverted input terminal IN+ of the comparator 102. Accordingly, the voltage Vin+ at the non-inverted input terminal IN+ of the comparator 102 does not become a high voltage, so that the gate of the PMOS 15 forming the comparator 102 is not supplied with the high voltage.

When the voltage Vu of the middle point wiring further increases, and at the time t65 exceeds a battery voltage VB of the battery 111 connected to the alternator 140. In this instance, the rectification MOSFET 101 of the rectifier 108uh at the high side is turned on to allow the rectified current to flow, and the voltage Vds between the drain and the source of the rectification MOSFET 101 in the rectifier 108ul at the low side becomes a high positive voltage which is the sum of an ON voltage of the rectifier 108uh at the high side and the battery voltage VB of the battery 111. The NMOS 24 of the shutoff control circuit 106 keeps on, and the output terminal OUT of the shutoff control circuit 106 keeps outputting the voltage of the L level. The shutoff MOSFET 105 is turned off, and a line between the drain of the rectification MOSFET 101 and the non-inverted input terminal IN+ of the comparator 102 is shut off by a shutoff MOSFET 105.

Subsequently, after completion of the rectification by the rectifier 108uh at the high side, the voltage Vu at the middle point wiring of the U-phase leg 131u decreases. In the rectifier 108ul, the voltage Vds between the drain and the source of the rectification MOSFET 101 decreases, and at time t66, as shown in FIG. 6A, the voltage Vds becomes under the threshold voltage Vth of the NMOS 24 in the shutoff control circuit 106. The NMOS 24 turns off, and as shown in FIG. 6C, the voltage Vshut at the output terminal OUT of the shutoff control circuit 106 changes to have a voltage of the H level. The shutoff MOSFET 105 turns on to electrically connect the drain of the rectification MOSFET 101 to the non-inverted input terminal IN+ of the comparator 102 of the control circuit 107. This connection makes again such a state that the drain voltage Vd of the rectification MOSFET 101 is applied to the non-inverted input terminal IN+ of the comparator 102 and the source voltage Vs of the rectification MOSFET 101 is applied to the inverted input terminal IN− of the comparator 102, so that the rectifier 108ul can perform the autonomous synchronous rectification operation.

The voltage Vu at a middle point of the wiring further decreases under the voltage of the negative-side terminal of the battery 111 at the time t67. The voltage Vds which is negative is applied to the non-inverted input terminal IN+ of the comparator 102, and as shown in FIG. 6E, a voltage of the H level of the capacitor 104 is outputted at the output terminal COUT of the comparator 102, i.e., the gate of the rectification MOSFET 101, so that the rectification MOSFET 101 turns on.

When the voltage Vu at the middle point wiring further decreases, the rectification MOSFET 101 of the rectifier 108ul at the low side allows the rectified current to flow therethrough. The state returns at the time t68 to the state which is the same as the state at the time t62. Hereinafter the operation from the time t62 to the time t68 repeated sequentially.

As the rectification operation is described with reference to FIGS. 6A to 6E in the rectifier 108 including the autonomous synchronous rectification MOSFET in the first embodiment, the shutoff control circuit 106 turns off the shutoff MOSFET 105 and electrically shuts off a line between the drain of the rectification MOSFET 101 and the non-inverted input terminal IN+ of the comparator 102 before the increase in the voltage of the drain of the rectification MOSFET 101 occurring after the completion of the rectified current flow. Further, in the rectifier 108, the shutoff control circuit 106 turns on the shutoff MOSFET 105 and connects the drain of the rectification MOSFET 101 to the non-inverted input terminal IN+ of the comparator 102 after the decrease in voltage of the drain of the rectification MOSFET 101 before the start of the rectified current flow.

This provides the rectification operation and can avoid the application of the high voltage at the drain of the rectification MOSFET 101 to the non-inverted input terminal IN+ of the comparator 102, i.e., the gate of the MOSFET connected to the non-inverted input terminal IN+ of the comparator 102.

FIGS. 7A to 7D are charts showing waveforms at respective points when a reverse surge caused by dump load at the rectifier 108 including the autonomous synchronous rectification MOSFET having two external terminal according to the first embodiment. A reverse surge of the dump load is applied to one rectifier 108. Axes of ordinates of FIGS. 7A to 7D are the same as those in FIGS. 6A to 6D.

Axes of abscissas in FIGS. 7A to 7D represent the same time among the charts.

The reverse surge is absorbed with the Zener diode 122 connected in parallel with the rectification MOSFET 101. However, the absorption is not limited to this method. The Zener diode 122 may be not additionally installed, but may be embedded into the MOSFET 101. Further, using an active clamping method, the surge may be absorbed by the rectification MOSFET 101, etc.

At time t70, a reverse surge is applied between the positive-side main terminal K and the negative-side main terminal A of the rectifier 108.

Figure 7A:
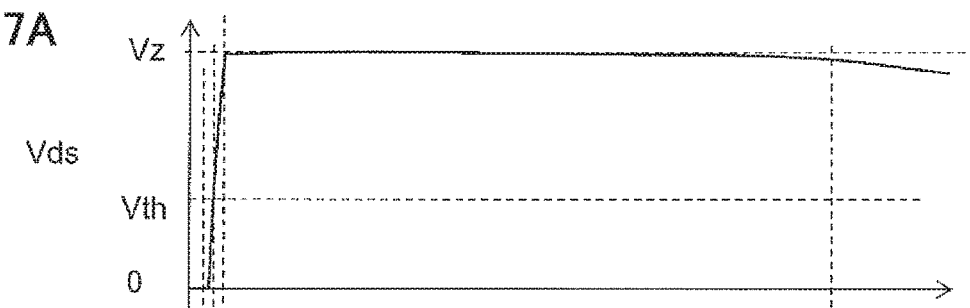
FIGS. 7A to 7D are charts of voltage and current waveforms in the rectifier when a reverse surge voltage is applied thereto in the first embodiment.
Figure 7B:
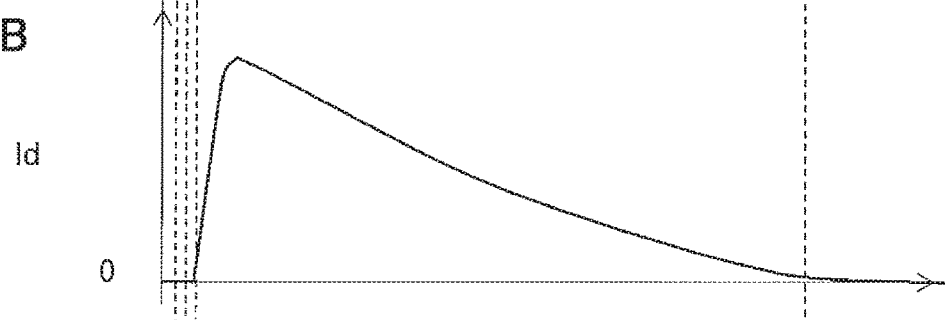
Figure 7C:
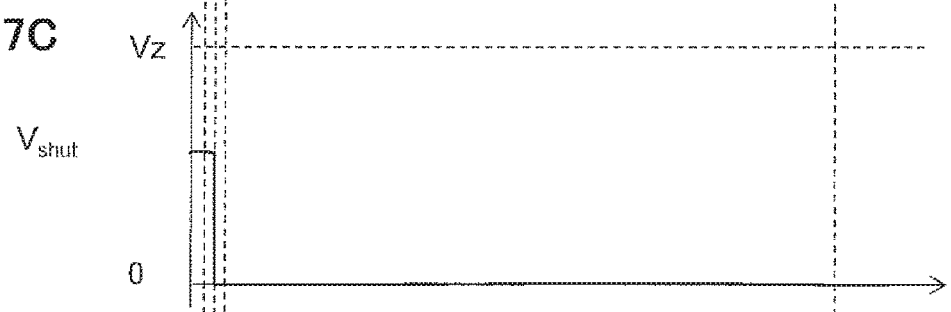
Figure 7D:
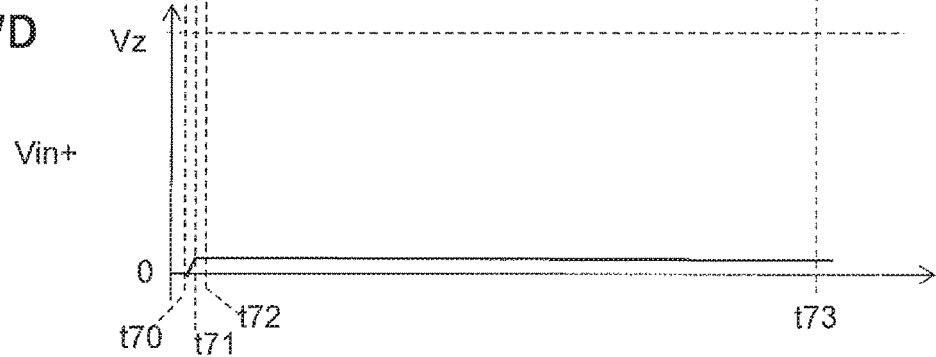

As shown in FIG. 7A, when the reverse surge is applied, and the voltage Vds between the drain and the source of the rectification MOSFET 101 starts to increase. As shown in FIG. 7B, the current Id does not flow. In this instance, the NMOS 24 in the shutoff control circuit 106 is in an OFF state, and the output terminal OUT of the shutoff control circuit 106 outputs a voltage of the H level by the capacitor 104. As shown in FIG. 7C, when no charges are left in the capacitor 104, a voltage Vshut is 0 V.

At a time t71, as shown in FIG. 7A, the voltage Vds between the drain and the source of the rectification MOSFET 101 exceeds the threshold voltage Vth of the NMOS 24 of the shutoff control circuit 106. The NMOS 24 becomes an ON state, and the voltage Vshut at the output terminal OUT of the shutoff control circuit 106 decreases to a voltage of the L level as shown in FIG. 7C. The shutoff MOSFET 105 turns off and electrically shuts off a line between the drain of the rectification MOSFET 101 and the non-inverted input terminal IN+ of the comparator 102 of the control circuit 107.

The Vds between the drain and the source of the rectification MOSFET 101 further increases, and at time t72, the Zener diode 122 clamps the voltage Vds at the voltage Vz at which the Zener diode 122 performs bypassing (see FIG. 7A). Further, when the surge is absorbed using the active clamping method with the rectification MOSFET 101, the voltage Vds is clamped by a voltage of a sum of the Zener voltage of the Zener diode forming the active clamp and a forward voltage drop of a diode connected in an opposite direction thereto.

As shown in FIG. 7B, a surge current flows between the two terminals of the rectifier 108. During this, a large surge voltage is applied to the drain of the rectification MOSFET 101. However, because the drain of the rectification MOSFET 101 and the non-inverted input terminal IN+ of the comparator 102 are shut off, as shown in FIG. 7B, the high voltage of the surge is not applied to the non-inverted input terminal IN+ of the comparator 102.

When the absorbing the surge is completed at time t73, as shown in FIG. 7A, the voltage Vds between the drain and the source of the rectification MOSFET 101 gradually decreases, but the high voltage is kept thereafter for a while. Until the voltage Vds between the drain and the source of the rectification MOSFET 101 decreases under the threshold voltage Vth of the NMOS 24 of the shutoff control circuit 106, a line between the drain of the rectification MOSFET 101 and the non-inverted input terminal IN+ of the comparator 102 in the control circuit 107 is kept in such a state that the high voltage is not applied to the non-inverted input terminal IN+ of the comparator 102.

As shown in FIGS. 7A to 7D by the voltage and current waveforms when the reverse surge of the damp load is applied, in the rectifier 108 using the autonomous synchronous rectification MOSFET in the first embodiment, before the increase in the drain voltage of the rectification MOSFET 101 as a result of application of the reverse surge of the damp load, the line between the drain of the rectification MOSFET 101 and the non-inverted input terminal IN+ of the comparator 102 is shut off. The shutoff state is kept until the drain voltage of the rectification MOSFET 101 decreases. This prevents the high voltage of the reverse surge, which is applied to the drain of the rectification MOSFET 101, from being applied to the non-inverted input terminal IN+ of the comparator 102, i.e., the gate of the MOSFET connected to the non-inverted input terminal IN+ of the comparator 102.

Next, a case in which the engine of a vehicle mounting the alternator 140 using the rectifier 108 of the autonomous synchronous rectification MOSFET having two external terminals according to the first embodiment (see FIG. 5) is stopped is described below. Even when the vehicle stops the engine and the alternator 140, electrical conduction (connection) between the alternator 140 to the battery 111 is kept. Accordingly, between the positive-side main terminal K and the negative-side main terminal A of either of the low side or the high side, application of the battery voltage VB of the battery 111 is kept. In the rectifier 108 to which the battery voltage VB is applied, the Vds between the drain and the source of the rectification MOSFET 101 is equal to or higher than the threshold voltage Vth of the NMOS 24 of the shutoff control circuit 106, and the shutoff MOSFET 105 is in an OFF state. Accordingly, the line (connection) between the drain of the rectification MOSFET 101 and the non-inverted input terminal IN+ of the comparator 102 in the control circuit 107 is shut off. Because the high voltage of the drain of the rectification MOSFET 101 is applied to the drain of the shutoff MOSFET 105, a leak current flows from the drain to the source of the shutoff MOSFET 105. The resistive element 112 allows the leak current to flow toward the negative-side main terminal A, so that a potential at the non-inverted input terminal IN+ of the comparator 102 does not increase. More specifically, even when the alternator 140 stops after the stop of the vehicle, the high voltage at the drain of the rectification MOSFET 101 is not applied to the non-inverted input terminal IN+ of the comparator 102, i.e., the gate of the MOSFET connected to the non-inverted input terminal IN+ of the comparator 102.

As described above, the application of the high voltage at the drain of the rectification MOSFET 101 to the gate of the MOSFET connected to the non-inverted input terminal IN+ of the comparator 102 can be prevented also during the rectification operation, the reverse surge application, and the stop of the vehicle. This can prevent the shift of the threshold voltage caused by the high voltage application to the gate of the MOSFET connected to the non-inverted input terminal IN+ of the comparator 102. As a result, this can prevent such a phenomenon that the voltage for switching the comparator 102 between ON and OFF shifts, so that the rectification MOSFET 101 can be turning on and off at appropriate timing.

Next, a rectifier 108A according to a second embodiment is described below with reference to FIGS. 8 to 11. In the rectifier 108A according to the second embodiment, a power supply for supplying power to respective parts of the control circuit 107 such as the comparator 102 and a gate drive circuit 115 is shut off to prevent the characteristic variation caused by the high voltage application and to operate respective parts of the control circuit 107 normally.

Figure 8:
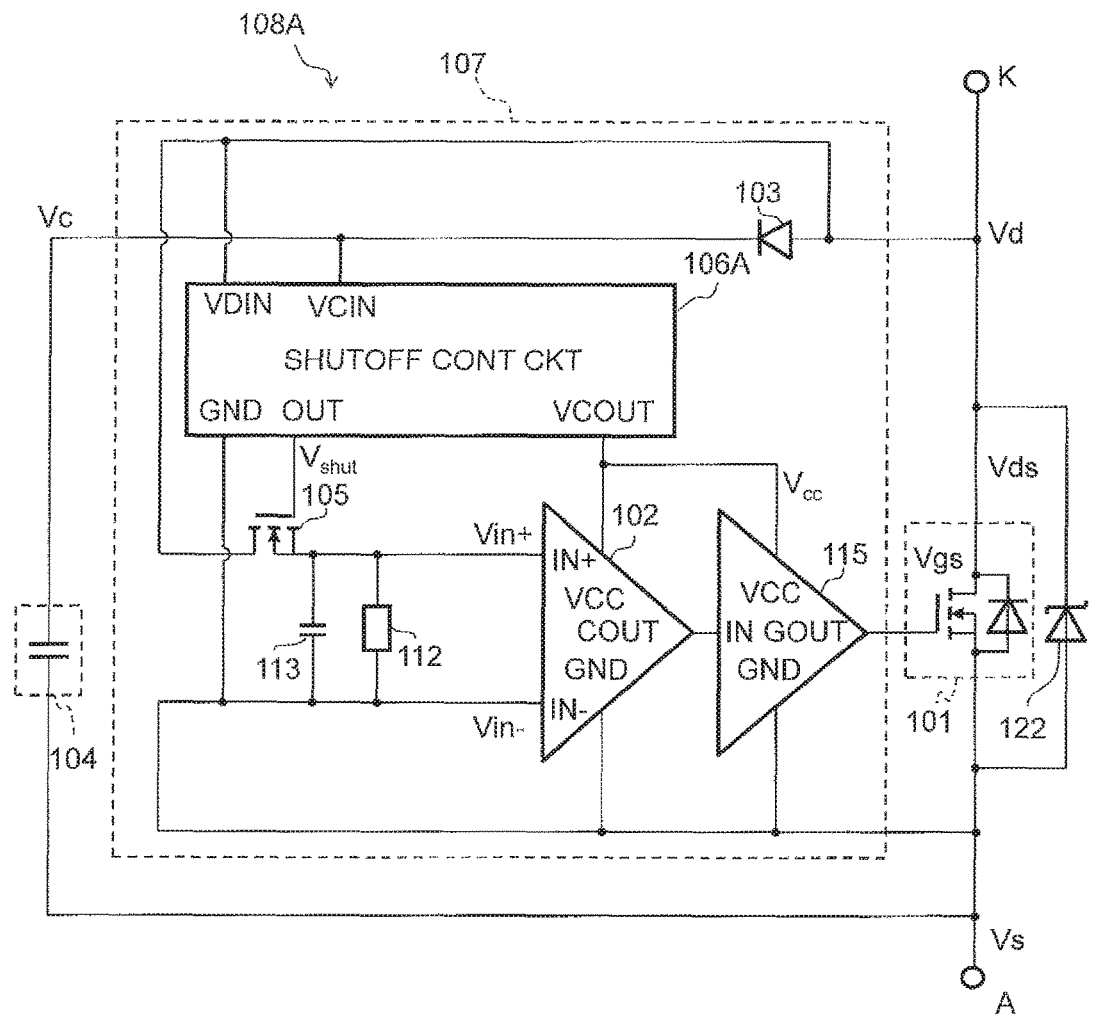
FIG. 8 is a circuit diagram of a rectifier using an autonomous synchronous rectification MOSFET according to a second embodiment.

FIG. 8 is a circuit diagram of a rectifier using an autonomous synchronous rectification MOSFET according to a second embodiment.

The rectifier 108A including the autonomous synchronous rectification MOSFET according to the second embodiment includes a shutoff control circuit 106A to which a capacitor voltage output terminal VCOUT is added to the shutoff control circuit 106 relative to the rectifier 108 in the first embodiment shown in FIG. 1, wherein the source voltage terminal VCC of the comparator 102 is connected to the capacitor voltage output terminal VCOUT of the shutoff control circuit 106A. The capacitor voltage output terminal VCOUT outputs a voltage Vcc.

The gate drive circuit 115 is further provided at the rear stage of the comparator 102. The output terminal COUT of the comparator 102 is connected to the input terminal IN of the gate drive circuit 115, and an output terminal GOUT of the gate drive circuit 115 is connected to the gate of the rectification MOSFET 101. Further, the capacitor voltage output terminal VCOUT of the shutoff control circuit 106A is connected to the source voltage terminal VCC of the gate drive circuit 115, and the ground terminal GND of the gate drive circuit 115 is connected to the negative-side main terminal A of the rectifier 108A. The comparator 102 having the same circuit as the comparator 102 (see FIG. 2) in the first embodiment is used. The gate drive circuit 115 may be omitted similarly to the rectifier 108 according to the first embodiment shown in FIG. 1. In that case, the output of the comparator 102 drives the gate of the rectification MOSFET 101. Further, the rectifier 108 according to the first embodiment may be provided with the gate drive circuit 115 (see FIG. 8).

Figure 9:
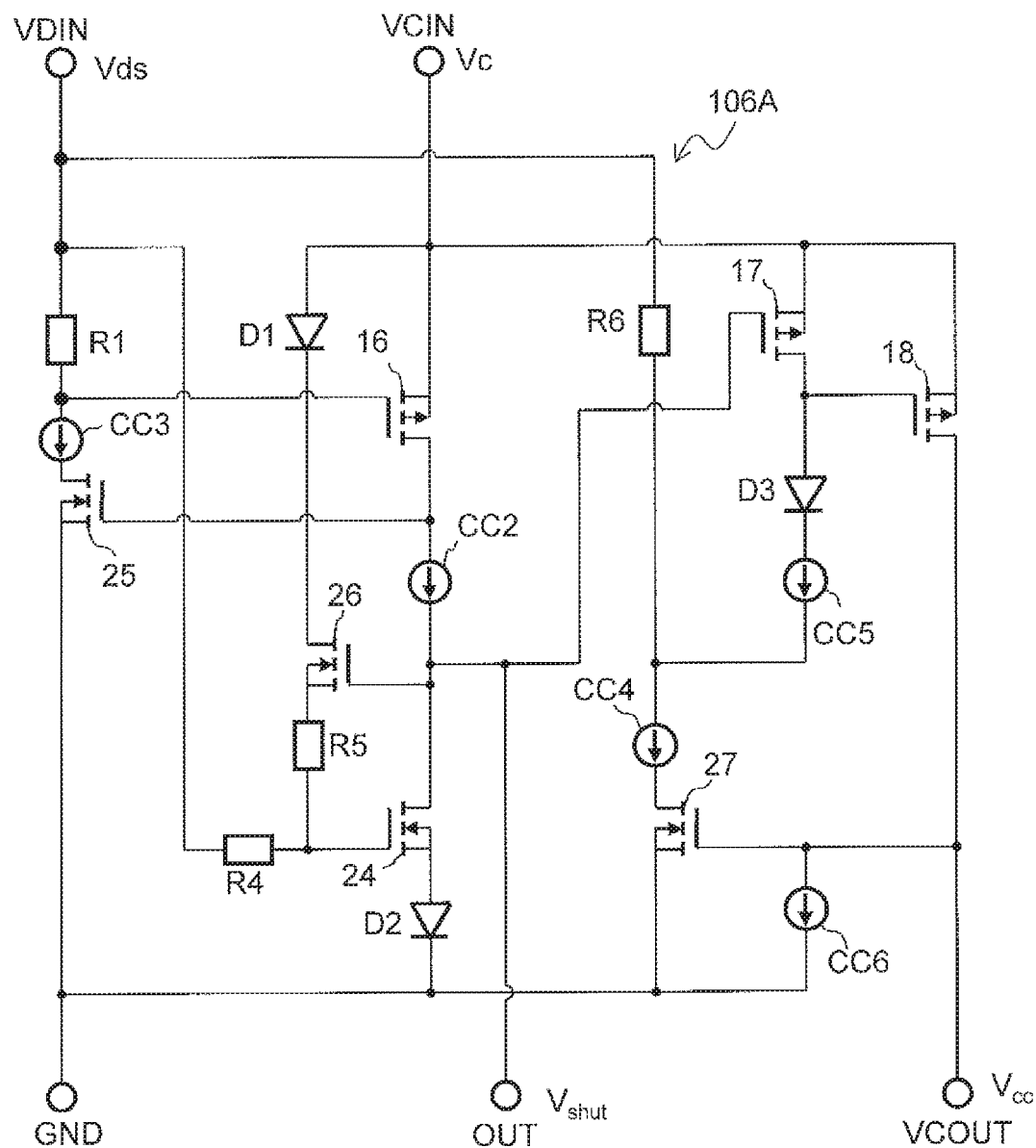
FIG. 9 is a circuit diagram of a shutoff control circuit included in the rectifier according to the second embodiment.

FIG. 9 is a circuit diagram of an example of a shutoff control circuit 106A included in the rectifier 108A according to the second embodiment.

A configuration of the shutoff control circuit 106A is described below. The shutoff control circuit 106A is configured including resistors R1, R4, R5, R6, PMOSs 17, 18, NMOSs 25, 26, 27, diodes D2, D3, and constant current circuits CC3, CC4, CC5, CC6 which are added to the configuration of the shutoff control circuit 106 according to the first embodiment (see FIG. 3) and further including the capacitor voltage output terminal VCOUT.

First, a configuration of the output terminal OUT of the shutoff control circuit 106A is described below.

The drain voltage input terminal VDIN is connected to the ground terminal GND through the resistor R1, the constant current circuit CC3, and the NMOS 25 and further connected to a gate of the NMOS 24 through the resistor R4. A source of the NMOS 24 is connected to the ground terminal GND through the diode D2, and a drain of the NMOS 24 is connected to the output terminal OUT. Accordingly, when the voltage Vds of the drain voltage input terminal VDIN is equal to or higher than a sum of (the threshold voltage Vth of the NMOS 24+the forward drop voltage Vf of the diode D2), the NMOS 24 turns on. This causes the voltage Vshut at the output terminal OUT to have the L level, which turns off the shutoff MOSFET 105. A connection node between the resistor R1 and the constant current circuit CC3 is connected to a gate of a PMOS 16. A gate of the NMOS 25 is connected to a drain of the PMOS 16, and the PMOS 16 and the NMOS 25 configure a latch circuit. This can detect a state at the drain voltage input terminal VDIN, and also can reduce a consumed current by shutoff (disconnection) of a line between the drain voltage input terminal VDIN and the ground terminal GND.

The capacitor voltage input terminal VCIN is connected to the output terminal OUT through the PMOS 16 and the constant current circuit CC2. The output terminal OUT is connected to the ground terminal GND through the NMOS 24 and the diode D2. Insertion of the diode D2 between the NMOS 24 and the ground terminal GND increased the threshold value of the voltage Vds, at which the NMOS 24 turns on and off by the forward drop voltage Vf, which suppresses an error operation when noises are applied to the voltage Vds.

The capacitor voltage input terminal VCIN is further connected to the gate of the NMOS 24 through a diode D1, an NMOS 26, and a resistor R5. A gate of the NMOS 26 is connected to the drain of the NMOS 24 and the output terminal OUT. When the voltage Vshut at the output terminal OUT is at the H level, the NMOS 26 increases the gate voltage of the NMOS 24, which causes the characteristic of the voltage Vshut to have hysteresis for the voltage Vds.

Next, a configuration of the capacitor voltage output terminal VCOUT of the shutoff control circuit 106A is described below.

The drain voltage input terminal VDIN is connected to the ground terminal GND through a resistor R6, a current regulator CC4, and an NMOS 27. The capacitor voltage input terminal VCIN is connected to a connection node between the resistor R6 and the current regulator CC4 through the PMOS 17, a diode D3, and a constant current circuit CC5, and also to the capacitor voltage output terminal VCOUT through a PMOS 18. The capacitor voltage output terminal VCOUT is connected to a gate of the NMOS 27 as well as to a ground terminal GND through a constant current circuit CC6. The drain of the NMOS 24 and the output terminal OUT are connected to a gate of the PMOS 17. A drain of the PMOS 17 is connected to a gate of the PMOS 18.

Figure 10A:
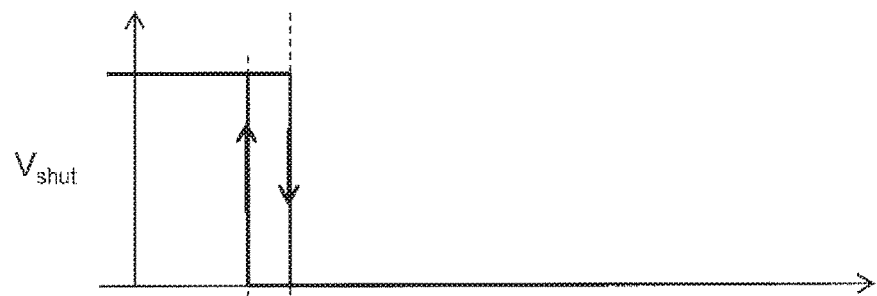
FIGS. 10A to 10C are charts illustrating an operation of the shutoff control circuit according to the second embodiment.
Figure 10B:
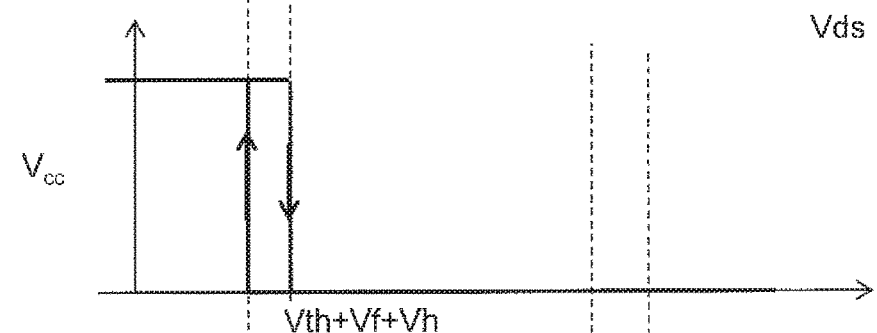
Figure 10C:
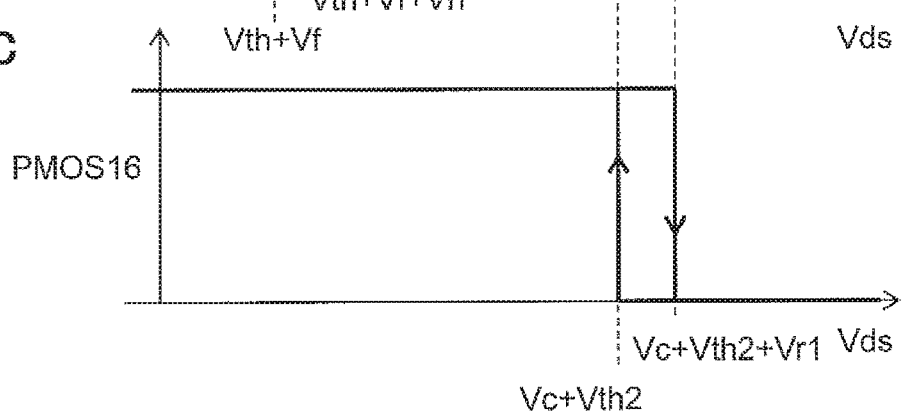

FIGS. 10A to 10C are charts illustrating an operation of the shutoff control circuit 106A according to the second embodiment.

FIG. 10A is a chart illustrating a relation between the voltage Vds and the voltage Vshut.

FIG. 10B is a chart illustrating a relation between the voltage Vds and the voltage Vcc.

FIG. 10C is a chart illustrating a conduction state of the PMOS 16 regarding the voltage Vds. Hereinafter, an operation of the shutoff control circuit 106A is described below with reference to FIGS. 9 and 10A to 10C.

A case in which the voltage Vds between the drain and source of the rectification MOSFET 101 decreases during the rectification operation is described below.

(Vds≥Vc+Vth2)

First, the Vds is equal to or higher than a summation voltage of (the voltage Vc of the capacitor voltage input terminal VCIN+a threshold voltage Vth2 of the PMOS 16), and the PMOS 16 and the NMOS 25 are in an OFF state (see FIG. 10C). Because the voltage Vds at this instance is equal to or higher than a summation voltage of (the threshold voltage Vth+the forward drop voltage Vf of the diode D2), the NMOS 24 is in an ON state. The voltage Vshut at the output terminal OUT becomes the L level (see FIG. 10A). Accordingly, the shutoff control circuit 106A turns off the shutoff MOSFET 105 and electrically shuts off a line between the drain of the rectification MOSFET 101 and the non-inverted input terminal IN+ of the comparator 102.

Because the voltage Vshut at the output terminal OUT is at the L level, the NMOS 25 and the NMOS 26 are on an Off state, and the PMOS 17 is in an ON state. A voltage of the H level equal to the voltage Vc is applied to a gate of the PMOS 18, so that the PMOS 18 turns off. Accordingly, the voltage Vcc at the capacitor voltage output terminal VCOUT becomes L level (see FIG. 10B). As a result, the source voltage terminal VCC of the comparator 102 is in such a state that the voltage Vc of the capacitor 104 is not applied to the source voltage terminal VCC of the comparator 102.

(Vds<Vc+Vth2)

Next, when the voltage Vds decreases below a sum voltage of (the voltage Vc+the threshold voltage Vth2 of the PMOS 16), the PMOS 16 turns on (see FIG. 10C). After this, an ON state of the PMOS 16 and an ON state of the NMOS 25 are kept. Turning on the PMOS 16 enables a shutoff control operation which is the same as the operation of the shutoff control circuit 106 (see FIG. 3) according to the first embodiment. Because the NMOS 25 is turning on, a current flows through the resistor R1 with a voltage drop in the resister R1.

The voltage Vds is equal to or higher than a sum of (the threshold voltage Vth of the NMOS 24+the forward drop voltage Vf of the diode D2), so that the NMOS 24 is in an ON state. Accordingly, the voltage Vshut at the output terminal OUT keeps at the L level (see FIG. 10A), which turns off the shutoff MOSFET 105. The voltage Vcc of the capacitor voltage output terminal VCOUT is also kept at the L level in the voltage (see FIG. 10B).

In other words, when the NMOS 24 is in an ON state, the Vshut at the output terminal OUT becomes the L level in voltage whichever the PMOS 16 is ON or OFF, so that the NMOS 26 turns off. When the NMOS 26 is in an OFF state, there is no current through the resistor R4 and the resistor R5, so that there is no voltage drop in the resistor R4.

Accordingly, the voltage Vds decreases below the sum of (the threshold voltage Vth of the NMOS 24+the forward drop voltage Vf of the diode D2), so that the NMOS 24 turns off.

(Vds<Vth+Vf)

When the voltage Vds further decreases below a sum of (the threshold voltage Vth of the NMOS 24+the forward voltage drop Vf of the diode D2), the NMOS 24 turns off, and the voltage Vshut of the output terminal OUT is at the H level (see FIG. 10A). Accordingly, the shutoff control circuit 106A turns on the shutoff MOSFET 105 to electrically connect the non-inverted input terminal IN+ of the comparator 102 of the control circuit 107 to the drain of the rectification MOSFET 101.

Turning off the NMOS 24 turns on the NMOS 26, which applies a bias voltage to the gate of the NMOS 24 through the resistor R5. Accordingly, the NMOS 24 has a hysteresis characteristic.

Further, turning off the NMOS 24 turns off the PMOS 17, and turning of the PMOS 17 turns on the PMOS 18. Turning on the PMOS 18 connects the capacitor voltage output terminal VCOUT to the capacitor voltage input terminal VCIN, so that the voltage Vcc becomes a H level voltage which is equal to the voltage Vc at the H level (see FIG. 10B). Accordingly, the source voltage terminal VCC of the comparator 102 is supplied with the voltage Vc of the capacitor 104, which causes the comparator 102 to enter a drivable state in which the comparator can be driven.

(Vds<0)

When the voltage Vds further decreases and has a negative value, the comparator 102 switches the output level to turn on the rectification MOSFET 101 to allow the rectification current to flow. At this time point, the PMOS 16, the NMOSs 26 and 25 are in an ON state, and the NMOS 24 is in an OFF state.

After this, cases in which the Vd between the drain and the source of the rectification MOSFET 101 increases during the rectification operation are described below.

(Vds≥0)

When the voltage Vds increases to have zero or a positive value of voltage from the negative value, the comparator 102 switches the output to turn off the rectification MOSFET 101. In this instance because the NMOS 26 has turned on, a current flows from the capacitor voltage input terminal VCIN to the drain voltage input terminal VDIN through the resistors R4 and R5, so that the resistor R4 has a voltage drop. This voltage drop is a hysteresis voltage Vh.

(Vds≥Vth+Vf+Vh)

When the voltage Vds further increases and is equal to or higher than a sum of (the threshold voltage Vth+the forward drop voltage Vf+the hysteresis voltage Vh), the NMOS 24 turns on and the voltage Vshut at the output terminal OUT changes to the L level (see FIG. 10A). Accordingly, the shutoff control circuit 106A turns off the shutoff MOSFET 105 and electrically shuts off a line between the drain of the rectification MOSFET 101 and the non-inverted input terminal IN+ of the comparator 102 in the control circuit 107.

In the second embodiment, the hysteresis voltage Vh can suppress vibrations in which connection and disconnection at the non-inverted input terminal IN+ of the comparator 2 are repeated. The hysteresis is unnecessary when the variation of the voltage Vds is rapid or steep in chart. In this case, the shutoff control circuit 106A (see FIG. 9) can be configured simply by omitting the diode D1, the NMOS 26, and the resistors R4, R5.

Turning on of the NMOS 24 turns off the NMOS 26, and the PMOS 17 turns on. Turning on of the PMOS 17 turns off the PMOS 18. Turning off of the PMOS 18 disconnects the capacitor voltage output terminal VCOUT from the capacitor voltage input terminal VCIN, so that the voltage Vcc changes to the voltage of the L level (see FIG. 10B). This makes a state in which the high voltage of the capacitor 104 is not applied to the source voltage terminal VCC of the comparator 102.

Insertion of the diode D2 between the NMOS 24 and the ground terminal GND can increase the threshold value of the voltage Vds, at which the shutoff MOSFET 105 turns on and off, by the forward drop voltage Vf. This can suppress an erroneous operation of turning off the shutoff MOSFET 105 due to application of noise voltages.

Further, when the noise voltage is sufficiently small, the diode D2 can be omitted. Omission of the diode D2 can decrease the voltage applied to the non-inverted input terminal IN+ of the comparator by the voltage drop in the diode D2, and the shutoff control circuit 106A can be configured simply.

($Vds \geq Vc+Vth2+Vr1$)

When the voltage Vds further increases and is equal to or higher than a sum of (the voltage Vc+the threshold voltage Vth2 of the PMOS 16+a voltage drop Vr1), the PMOS 16 and the NMOS 25 turn off (see FIG. 10C), and after this, the OFF states of the PMOS 16 and the NMOS 25 are kept. When the PMOS 16 and the NMOS 25 turn off, a current flowing from the drain voltage input terminal VDIN to the ground terminal GND and a current flowing from the capacitor voltage input terminal VCIN to the ground terminal GND can be suppressed. When the current from a capacitor voltage input terminal VCIN can be suppressed, this suppresses consumption of charges in the capacitor 104, which results in reduction in capacitance of the capacitor 104, so that a cost and an installing area of the capacitor 104 can be reduced.

It is assumed that the voltage Vc of the capacitor voltage input terminal VCIN is 12V, the threshold voltage Vth2 of the PMOS 16 is −1.5V, the threshold voltage Vth of the NMOS 24 is 1.5V, the voltage drop Vr1 of the resistor R1 when the PMOS 16 is turned off is 0.5V, and a hysteresis Vh is not considered. In the case in which the voltage Vds between the drain and source of the rectification MOSFET 101 decreases, when the voltage Vds decreases below 10.5 V, a PMOS 16 turns on, and when the voltage Vds decreases below 1.5 V, the shutoff of the non-inverted input terminal IN+ of the comparator 102 is stopped. When the voltage between the drain and source of the rectification MOSFET 101 increases and is equal to or higher than 1.5V, the non-inverted input terminal IN+ of the comparator 102 is disconnected, and when the voltage Vds is equal to or higher than 11V, the PMOS 16 turns off. In other words, the consumed current in the shutoff control circuit 106A can be suppressed without interference with the disconnection and connection of the non-inverted input terminal IN+ of the comparator 102.

As described above, the shutoff control circuit 106A according to the second embodiment (see FIG. 9) includes a latch circuit including the PMOS 16 and the NMOS 25, the hysteresis application circuit including the diode D1, the NMOS 26, the resistors R4, R5, and the diode D2 to be resistible to noises. These circuit and elements are applicable to the shutoff control circuit 106 according to the first embodiment (see FIG. 2).

Next, a case in which a reverse surge is applied between the positive-side main terminal K and the negative-side main terminal A is considered. When the voltage Vds between the drain and source of the rectification MOSFET 101 exceeds a sum voltage of the threshold voltage Vth of the NMOS 24 and the forward drop voltage Vf of the diode D2, the NMOS 24 turns on. At this point of time, the voltage Vshut of the output terminal OUT is a voltage of the L level (see FIG. 10A), and the shutoff MOSFET 105 electrically shuts off a line between the positive-side main terminal K and the non-inverted input terminal IN+.

Turing on of the NMOS 24 turns on the PMOS 17, and a voltage of the H level, which is equal to the voltage Vc, is applied to the gate of the PMOS 18, turning off the PMOS 18. Further, the voltage Vcc of the capacitor voltage output terminal VCOUT becomes a voltage of the L level (see FIG. 10B).

Accordingly, during application of the reverse surge, the source voltage terminal VCC is in a state that the high voltage of the capacitor 104 is not applied to the source voltage terminal VCC of the comparator 102.

Next, a case in which the vehicle is stopped and a high voltage of the battery 111 is kept to be applied between the positive-side main terminal K and the negative-side main terminal A of the rectifier 108A is considered. When a sufficient time has passed from when the high voltage of the battery 111 is kept being applied between the positive-side main terminal K and the negative-side main terminal A, of the rectifier 108A, the voltage Vds between the drain and the source of the rectification MOSFET 101 becomes approximately equal to the voltage Vc of the capacitor 104. In this voltage state, the PMOS 16 is in an OFF state, so that the OFF state of the PMOS 16 and the OFF state of the NMOS 25 are kept. Turning off the PMOS 16 and the NMOS 25 suppresses the current flowing from the drain voltage input terminal VDIN to the ground terminal GND and the current flowing from the capacitor voltage input terminal VCIN to the ground terminal GND. In other words, even when the vehicle is stopping, the shutoff control circuit 106A suppresses the consumed current which continuously flows. This can suppress leakage of charges in the battery 111 connected to the alternator.

The voltage Vds between the drain and the source of the rectification MOSFET 101 exceeds a sum voltage of (the threshold voltage Vth of the NMOS 24 and the forward drop voltage Vf of the diode D2), the NMOS 24 turns on. The voltage Vshut of the output terminal OUT becomes a voltage of the L level (see FIG. 10A), and the shutoff MOSFET 105 electrically shuts off a line between the positive-side main terminal K and the non-inverted input terminal IN+.

When the NMOS 24 turns on, the PMOS 17 turns on, and the PMOS 18 turns off. The voltage Vcc of the capacitor voltage output terminal VCOUT becomes a voltage of the L level (see FIG. 10B).

Accordingly, during the stop of the vehicle, the source voltage terminal VCC of the comparator 102 is in such a state that the high voltage of the capacitor 104 is not applied to the source voltage terminal VCC of the comparator 102.

Figure 11:
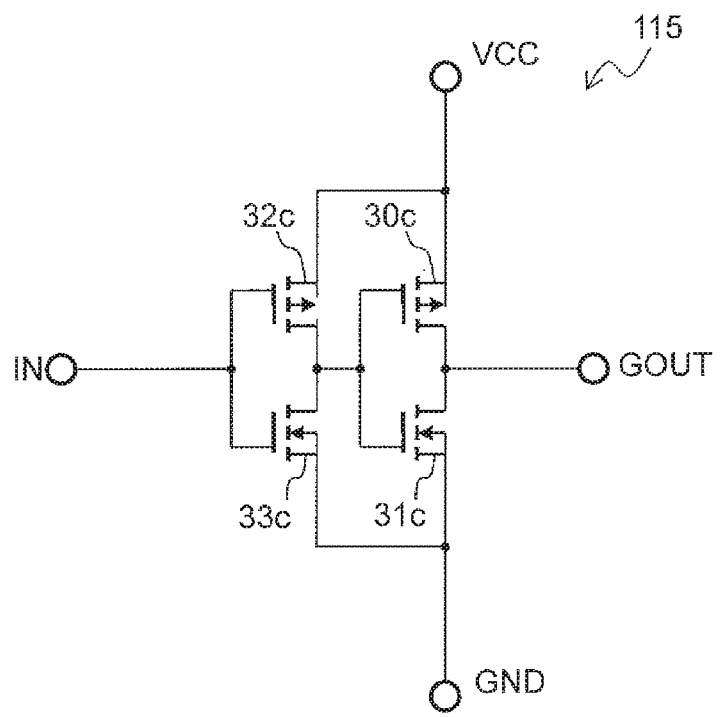
FIG. 11 is a circuit diagram of a gate drive circuit included in the rectifier according to the second embodiment.

FIG. 11 is a circuit diagram of a gate drive circuit included in the rectifier according to the second embodiment.

The gate drive circuit 115 includes two-stages of CMOS buffers including the PMOSs 30c, 32c and NMOSs 31c, 33c. The gate drive circuit 115 can drive the gate of the rectification MOSFET 101 at a higher speed based on the output of the comparator 102. FIG. 11 shows an example of the two-stages of CMOS buffers. However, the number of the CMOS buffers may be changed.

When a high voltage is applied to the drain of the rectification MOSFET 101 during the rectification operation, during a reverse surge application, and during the stop of a vehicle, the use of the rectifier 108A prevents the high voltage from being applied to the source voltage terminal VCC of the comparator 102, further to the source voltage terminal VCC of the gate drive circuit 115. In the gate drive circuit 115 in FIG. 11, when the high voltage is applied to the source voltage terminal VCC of the gate drive circuit 115, the high voltage is applied between the gates and the sources of a part of MOSFETs forming the gate drive circuit 115 or between the gates and the substrate, which may deteriorate a reliability of the gate oxidation film. Prevention of the high voltage from being applied to the source voltage terminal VCC of the gate drive circuit 115 using the rectifier 108A according to the second embodiment keeps the reliability of the MOSFETs forming the gate drive circuit 115.

As described above, when the voltage Vds between the drain and the source of the rectification MOSFET 101 becomes a high voltage during the rectification operation, during application of the reverse surge, and during the stop of the vehicle, the use of the rectifier 108A in FIG. 8 and the shutoff control circuit 106A in FIG. 9 shuts off, similarly to the first embodiment, a line between the drain of the part rectification MOSFET 101 from the non-inverted input terminal IN+ to prevent the high voltage from being applied to the non-inverted input terminal IN+ and shuts off a line between the source voltage terminal VCC of the comparator 102 and the capacitor 104 to prevent the high voltage from being applied also to the source voltage terminal VCC of the comparator 102. In the comparator 102 in FIG. 2, when the high voltage is applied to the source voltage terminal VCC connected to the capacitor 104, the high voltage is applied to the substrates of the PMOS 14 and the PMOS 15 connected to the input terminal of the comparator 102. Accordingly, an electric field is applied to the gate insulation films of the PMOS 14 and the PMOS 15, which may shift threshold voltages of the PMOS 14 and the PMOS 15. The shutoff of the line between the source voltage terminal VCC of the comparator 102 can prevent the threshold voltages of the PMOS 14 and the PMOS 15 forming the comparator 102 from being shifted. This can prevent such a phenomenon that the voltage at which switching between ON and OFF of the comparator 102 from shifting, which impedes appropriate timing of turn on and off of the rectification MOSFET 101.

Next, a rectifier 108B according to a third embodiment is described below with reference to FIGS. 12 to 14. In the rectifier 108B according to the third embodiment, a short-circuit MOSFET 118 is installed between the non-inverted input terminal IN+ and the inverted input terminal IN− of the comparator 102 to electrically short-circuit between the non-inverted input terminal IN+ and the inverted input terminal IN− after shutoff of the line between the non-inverted input terminal IN+ and the drain of the rectification MOSFET 101. This suppresses characteristic change due to the resistive element 112 and prevents a floating state of the non-inverted input terminal IN+.

Figure 12:
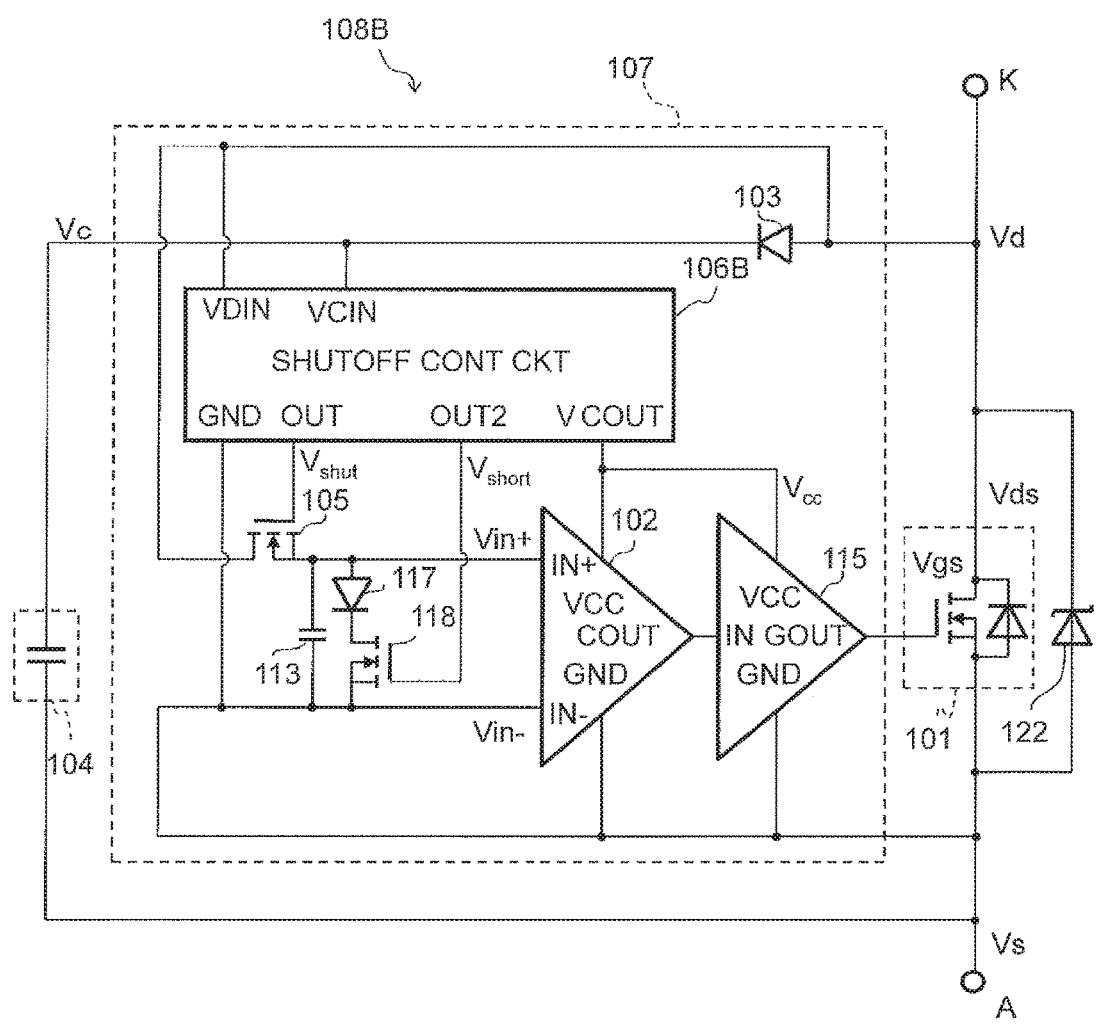
FIG. 12 is a circuit diagram of a rectifier using an autonomous synchronous rectification MOSFET according to a third embodiment.

The rectifier 108B shown in FIG. 12 further includes, relatively to the rectifier 108A according to the second embodiment shown in FIG. 8, a second output terminal OUT2 which is added to the shutoff control circuit 106A and a diode 117 and a short-circuit MOSFET 118, connected in series, between the non-inverted input terminal IN+ and the inverted input terminal IN− of the comparator 102. The second output terminal OUT2 of a shutoff control circuit 106B is connected to a gate of the short-circuit MOSFET 118. A voltage applied to the second output terminal OUT2 is called a voltage Vshort.

Figure 13:
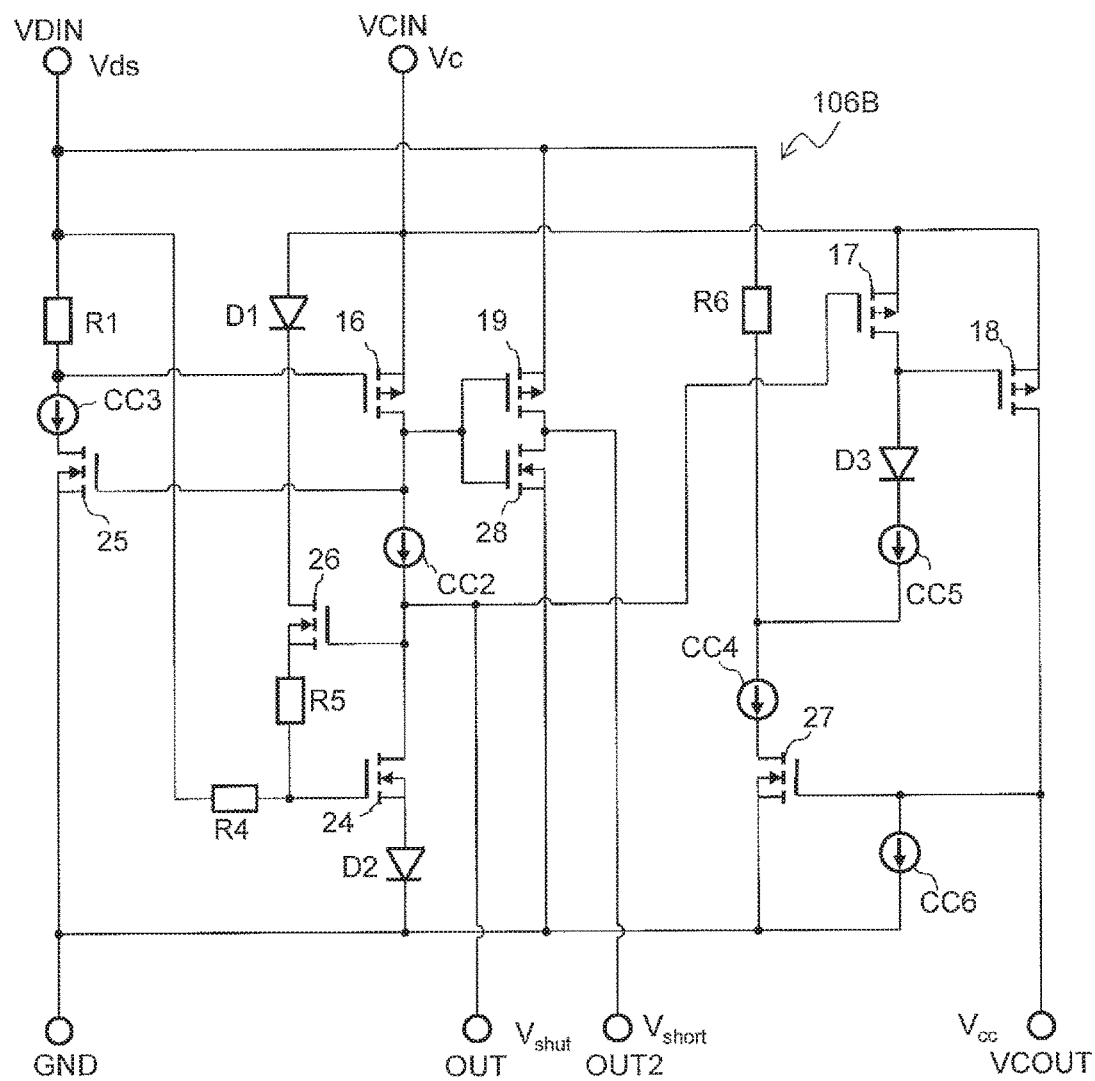
FIG. 13 is a circuit diagram of a shutoff control circuit included in the rectifier according to the third embodiment.

FIG. 13 is a circuit diagram of an example of a shutoff control circuit 106B included in the rectifier 108B according to the third embodiment.

In the shutoff control circuit 106B shown in FIG. 13, a PMOS 19 and an NMOS 28 are added to the shutoff control circuit 106A shown in FIG. 12. The PMOS 19 and the NMOS 28 form a CMOS inverter, and an input side of the CMOS inverter is connected to a drain of the PMOS 16. An output side of the CMOS inverter is connected to an output terminal OUT2.

Figure 14A:
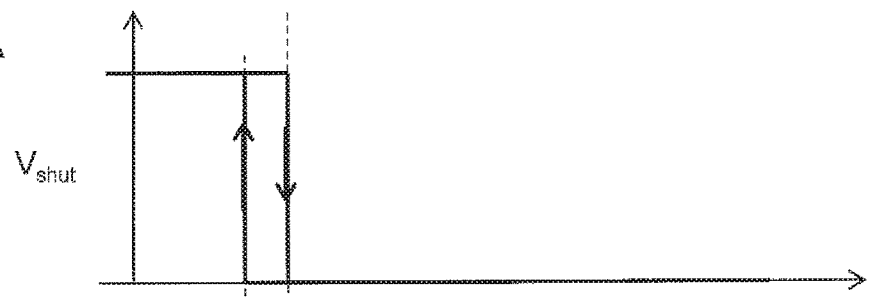
FIGS. 14A to 14D are charts illustrating an operation of the shutoff control circuit according to the third embodiment.
Figure 14B:
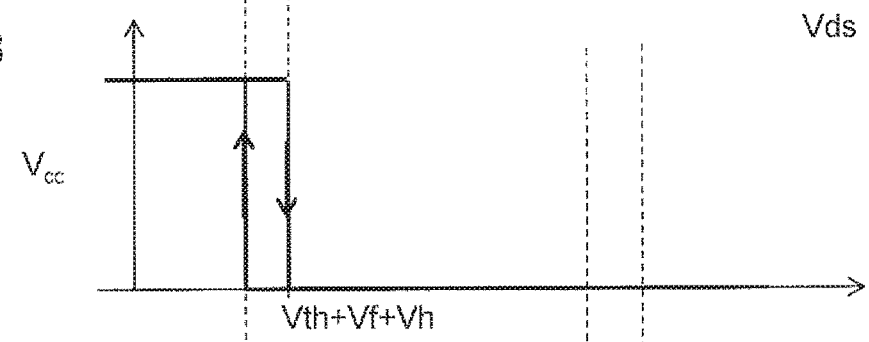
Figure 14C:
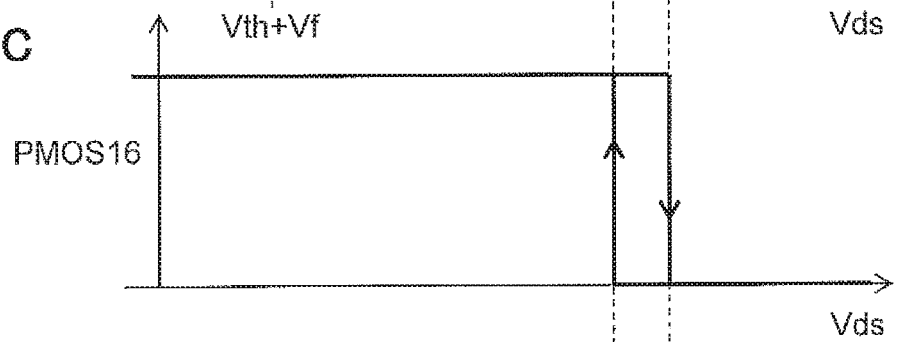
Figure 14D:
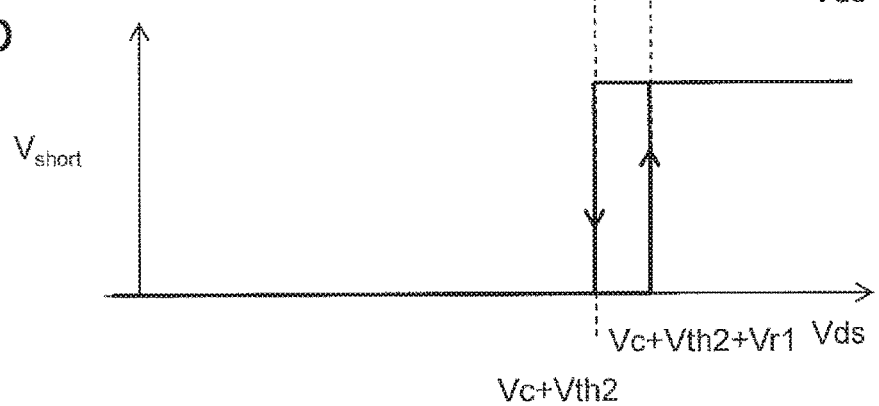

FIGS. 14A to 14D are charts illustrating an operation of the shutoff control circuit 106B according to the third embodiment. FIG. 14A is a chart illustrating a relation between the voltage Vds and the voltage Vshut. FIG. 14B is a chart illustrating a relation between the voltage Vds and the voltage Vcc. FIG. 14C is a chart illustrating a relation between the voltage Vds and a conduction state of the PMOS 16. FIG. 14D is a chart illustrating a relation between the voltage Vds and the voltage Vshort. Hereinafter, an operation of the shutoff control circuit 106B is described below with reference to FIG. 13 and FIG. 14D. FIGS. 14A to 14C are charts illustrating relations similar to relations in FIGS. 10A to 10C.

($Vds < Vc + Vth2$)

During the rectification operation, a case where the voltage Vds between the drain and the source of the rectification MOSFET 101 drops is described. When the voltage Vds decreases under a sum of (the voltage Vc+the threshold voltage Vth2 of the PMOS 16), so that the PMOS 16 turns on, a voltage of the H level equal to the voltage Vc is applied to the CMOS inverter including the PMOS 19 and the NMOS 28, and the COMS inverter outputs a voltage of the L level. Accordingly, a voltage Vshort of the second output terminal OUT2 becomes a voltage of the L level (see FIG. 14D), the short-circuit MOSFET 118 turning off, so that the non-inverted input terminal IN+ and the inverted input terminal IN− are disconnected. As a result, the drain voltage Vd of the rectification MOSFET 101 is applied to the non-inverted input terminal IN+ of the comparator 102, and the source voltage Vs of the rectification MOSFET 101 is applied to the inverted input terminal IN− of the comparator 102, and the rectifier 108$ul$ can perform an operation of the autonomous synchronous rectification operation.

($Vds \geq Vc + Vth2 + Vr1$)

During the rectification operation a case where the Vds between the drain and the source of the rectification MOSFET 101 increases, is described below. When the voltage Vds is equal to or higher than the sum of (the voltage Vc+the threshold voltage Vth2 of the PMOS 16+the voltage drop Vr1 by the resistor R1) and the PMOS 16 turns off, a voltage of the L level is inputted to the CMOS inverter including the PMOS 19 and the NMOS 28, so that the CMOS inverter outputs a voltage of the H level equal to the voltage Vc. Accordingly, the voltage Vshort of the second output terminal OUT2 becomes the voltage of the H level equal to the voltage Vc (see FIG. 14D), so that the short-circuit MOSFET 118 turns on, and the non-inverted input terminal IN+ and the inverted input terminal IN− of the comparator 102 are short-circuited. As a result, the voltage of the non-inverted input terminal IN+ of the comparator 102 becomes a voltage of the L level which is the same as the source of the rectification MOSFET 101. This provides such a state that the high voltage is not applied to the gate of the PMOS 15 (see FIG. 2) connected to the non-inverted input terminal IN+ of the comparator 102 during the rectification operation, In the case where the reverse surge is applied between the positive-side main terminal K and the negative-side main terminal A of the rectifier 108, when the voltage Vds between the drain and the source of the rectification MOSFET 101 is equal to or higher than a sum voltage of (the voltage Vc+the threshold voltage Vth2 of the PMOS 16+the voltage drop Vr1 by the resistor R1), the PMOS 16 turns off similarly to the rectification operation. The voltage Vshort of the second output terminal OUT2 becomes a voltage of the H level equal to the voltage Vc, and the short-circuit MOSFET 118 turns on, so that the non-inverted input terminal IN+ and the inverted input terminal IN− of the comparator 102 are short-circuited. As a result, the voltage of the non-inverted input terminal IN+ of the comparator 102 becomes the voltage of the L level which is the same as that of the source of the rectification MOSFET 101. This provides such a state that the high voltage is not applied to the gate of the PMOS 15 (see FIG. 2) connected to the non-inverted input terminal IN+ of the comparator 102 during application of the reverse surge.

In the case where the high voltage of the battery 111 is kept being applied between the positive-side main terminal K of the rectifier 108 and the negative-side main terminal A of the rectifier 108, when the voltage Vds between the drain and source of the rectification MOSFET 101 is equal to or higher than the sum voltage of (the voltage Vc+the threshold voltage Vth2 of the PMOS 16+the voltage drop Vr1 by the resistor R1), the PMOS 16 turns on similarly to the rectification operation. The voltage Vshort of the second output terminal OUT2 becomes the voltage of the H level equal to the voltage Vc, so that the short-circuit MOSFET 118 turns on. This short-circuits the non-inverted input terminal IN+ and the inverted input terminal IN− of the comparator 102. As a result, the voltage of the non-inverted input terminal IN+ of the comparator 102 becomes the voltage of the L level, which is the same as the source of the rectification MOSFET 101. This provides such a state that the high voltage is not applied to the gate of the PMOS 15 (see FIG. 2) connected to the non-inverted input terminal IN+ of the comparator 102 during the reverse surge application.

In the rectifier 108 according to the third embodiment, when the high voltage is applied to the drain of the rectification MOSFET 101 during the rectification operation, during the reverse surge application, and during a vehicle stopping, the short-circuit MOSFET 118 turns on, so that the non-inverted input terminal IN+ and the IN− are short-circuited, which provides such a state that the high voltage is not applied to the non-inverted input terminal IN+ of the comparator 102. Accordingly, the high voltage is not applied to the gate of the PMOS 15 (see FIG. 2) connected to the non-inverted input terminal IN+ of the comparator 102. This prevents the shift of the threshold voltage of the PMOS 15 (see FIG. 2). This prevents such a phenomenon that the voltage switches between ON and OFF of the comparator 102 shifts, so that the turning on and off of the rectification MOSFET 101 cannot be done at a suitable timing.

As described above, the case where the rectifier 108 is used in the alternator has been described. The rectifier 108 according to the present invention can be used in the rectifying circuit of the power supply.

Figure 15:
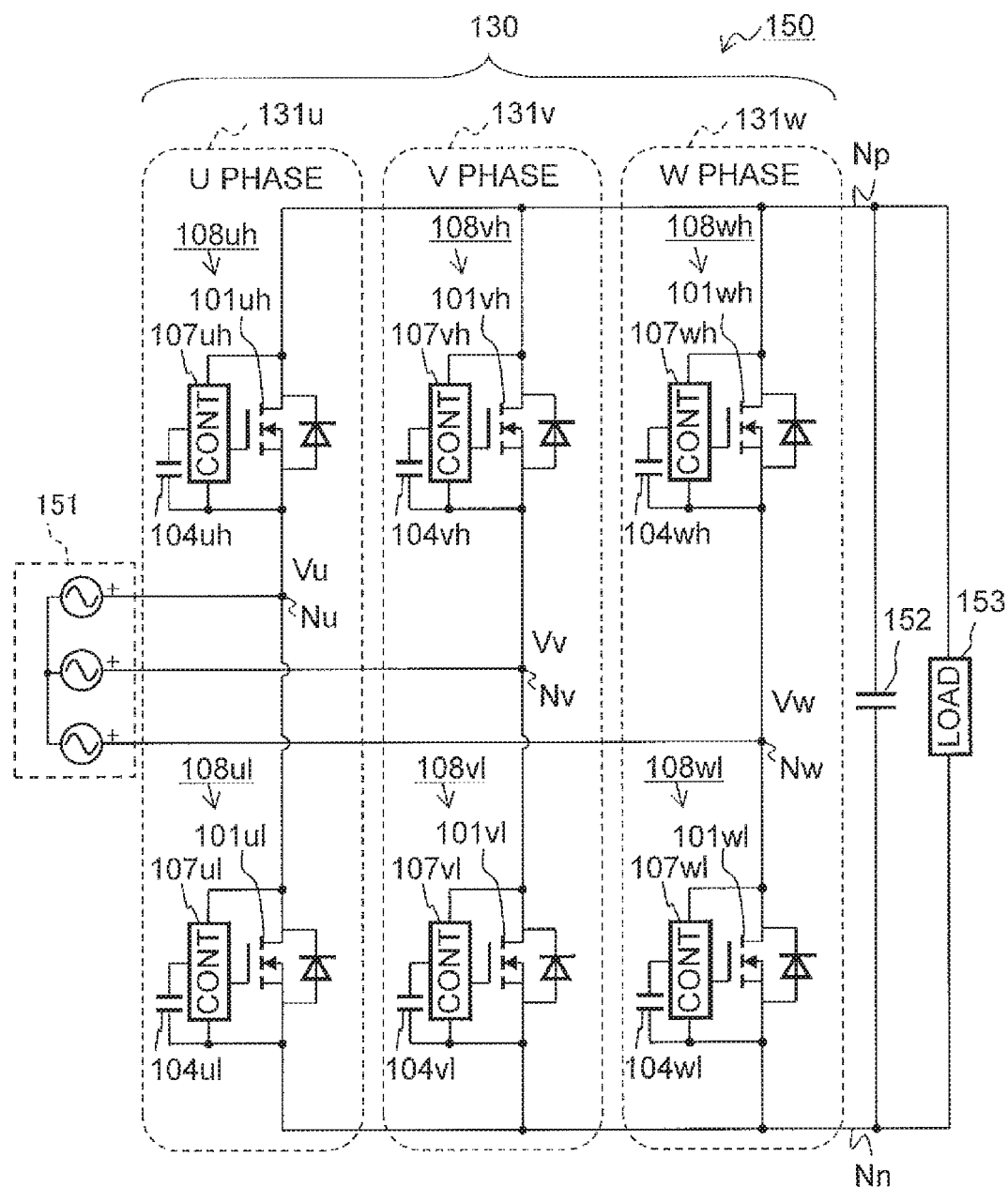
FIG. 15 is a circuit diagram illustrating a general configuration of a power supply using rectifiers according to a fourth embodiment.

FIG. 15 is a circuit diagram illustrating a general configuration of a power supply using the autonomous type of rectifier 108 according to a fourth embodiment.

As shown in FIG. 15, a power supply 150 using the autonomous synchronous rectifier 108 includes the rectification circuit 130 similarly to the alternator 140 according to the first embodiment (see FIG. 5), and is connected to a three-phase AC power source 151 instead of the power generator part, and connected to a smoothing capacitor 152 and a load 153 instead of the battery 111.

The three-phase AC power source 151 is connected to the nodes Nu, Nv, Nw to be supplied with three-phase AC voltages. The smoothing capacitor 152 smoothes a DC voltage applied by the rectification circuit 130. The load 153 consumes a power applied of the DC voltage.

The rectifier 108 is, for example, the same as the rectifier 108 according to the first embodiment. The use of the rectifier 108 as the power source, though the high voltage of the smoothing capacitor 152 is applied to a drain of the synchronous rectification MOSFET, a low loss rectification can be performed without causing a characteristic variation due to application of the high voltage.

Further, the rectifier used in the power supply 150 is not limited to the rectifier 108 according to the first embodiment, and the rectifier 108 according to the second embodiment and the rectifier 108B according to the third embodiment can be used, and the rectifier is not limited to the described embodiments.

The present invention is not limited to the above-described embodiments, and includes various modifications. For example, the above-described embodiments are described in detail for easy understanding the present invention, the embodiments are not limited to an embodiment including all configurations described above. A part of a configuration according to one embodiment can be replaced with a part of another embodiment and it is possible to add a part of another embodiment to the configuration of one configuration. Further, a part of the configurations of each embodiment can be subject to omission, addition of a part of a configuration of other embodiment, and replacement with a part of the configuration of other embodiment.

In each of the embodiments, only the control signal lines and information signal lines, necessary for explanation are shown, i.e., not all of control signal lines and information signal lines necessary for a product are shown. Actually, it can be considered that almost all components are connected with each other.

A LIST OF REFERENCE NUMERALS 101 rectification MOSFET
102 comparator (DECISION CIRCUIT)
103, 117 diode
104 capacitor
105 shutoff MOSFET
106, 106A, 106B shutoff control circuit
107 control circuit
108, 108A, 108B rectifier
109 rotor coil
110$uv$, 110$vw$, 110$wu$ stator coil
111 battery
112 resistive element
113 capacitor
115 gate drive circuit
118 short-circuit MOSFET
130 rectifier
140 alternator
150 power supply
151 three-phase AC power source
152 smoothing capacitor
153 load
11 to 19 PMOS (p-type MOSFET)
21 to 28 NMOS 21 (n-type MOSFET)
30$c$, 32$c$ high-side P-type MOSFET
31$c$, 33$c$ low-side n-type MOSFET
CC1 to CC6 constant current circuit
D1 to D3 diode
IN+ non-inverted input terminal
IN− inverted input terminal Vds drain-source voltage
Nu, Nv, Nw node (AC terminal)
Np, Nn node (DC terminal)
K positive-side main terminal (one of a pair of main terminals)
A negative-side main terminal (another of the main terminals)
OUT output terminal
COUT output terminal
GND ground terminal
VCC source voltage terminal
VDIN drain voltage input terminal
VCIN capacitor voltage input terminal
VCOUT capacitor voltage output terminal
OUT2 second output terminal

The invention claimed is:

1. A rectifier comprising:
a rectification MOSFET which performs rectification;
a control circuit including a comparator including:
 a first input terminal connected to a drain of the rectification MOSFET;
 a second input terminal connected to a source of the rectification MOSFET; and
 an output which controls turning on and off of the rectification MOSFET, wherein the control circuit further includes:
a shutoff MOSFET, installed between the drain of the rectification MOSFET and the first input terminal of the comparator, performing shutoff; and
a shutoff control circuit which turns off the shutoff MOSFET to shut off electrically the lines between the drain of the rectification MOSFET and the first input terminal of the comparator when a voltage of the drain of the rectification MOSFET is equal to or higher than a first predetermined voltage, and turns on the shutoff MOSFET to conduct electrically the line between the drain of the rectification MOSFET and the first input of the comparator when the voltage of the drain of the rectification MOSFET is lower than the first predetermined voltage, wherein
 the first predetermined voltage is lower than a voltage of the electric power supplied to the control circuit.

2. The rectifier as claimed in claim 1, wherein the first input terminal of the comparator is connected to a gate of one of a plurality of the MOSFETs forming the comparator.

3. The rectifier as claimed in claim 1, wherein the shutoff control circuit includes an n-type MOSFET including a gate connected to the drain of the rectification MOSFET,
wherein the shutoff control circuit turns off the shutoff MOSFET by turning on the n-type MOSFET and turns on the shutoff MOSFET by turning off the n-type MOSFET.

4. The rectifier as claimed in claim 1, further comprising a capacitor connected between the first and second input terminals of the comparator.

5. The rectifier as claimed in claim 1, further comprising a resistor providing short-circuiting between the first input terminal of the comparator and a source of the rectification MOSFET.

6. The rectifier as claimed in claim 1, further comprising a short-circuit MOSFET to provide short-circuiting between the first input terminal of the comparator and a source of the rectification MOSFET,
wherein the shutoff control circuit includes:
 a circuit configured to turn on the short-circuit MOSFET when the voltage of the drain of the rectification MOSFET is equal to or higher than a second predetermined voltage which is higher than the first predetermined voltage and turn off the short-circuit MOSFET when the voltage of the drain of the rectification MOSFET is lower than the second predetermined voltage.

7. The rectifier as claimed in claim 1, wherein the control circuit further comprises a capacitor supplying an electric power to the control circuit.

8. The rectifier as claimed in claim 7, wherein the shutoff control circuit comprises a circuit which performs
electrical shutoff between a positive terminal of the capacitor and a source voltage terminal of the comparator when the voltage of the drain of the rectification MOSFET is equal to or higher than a predetermined voltage and
electrical conduction between the positive terminal of the capacitor and the source voltage terminal of the comparator when the voltage of the drain of the rectification MOSFET is lower than the predetermined voltage.

9. The rectifier as claimed in claim 7, wherein the control circuit comprises a gate drive circuit,
wherein the shutoff control circuit performs
the electrical shutoff of a line between the positive terminal of the capacitor and a source voltage terminal of the gate drive circuit when the voltage of the drain of the rectification MOSFET is equal to or higher than a predetermined voltage; and
electrical conduction of the line between the positive terminal of the capacitor and the source voltage terminal of the gate drive circuit when the voltage of the drain of the rectification MOSFET is lower than the predetermined voltage.

10. An alternator comprising the rectifier as claimed in claim 1.

11. A power supply comprising the rectifier as claimed in claim 1.

* * * * *